United States Patent
Miyagi et al.

(10) Patent No.: US 8,218,124 B2
(45) Date of Patent: Jul. 10, 2012

(54) SUBSTRATE PROCESSING APPARATUS WITH MULTI-SPEED DRYING HAVING RINSE LIQUID SUPPLIER THAT MOVES FROM CENTER OF ROTATED SUBSTRATE TO ITS PERIPHERY AND STOPS TEMPORARILY SO THAT A DRYING CORE CAN FORM

(75) Inventors: Tadashi Miyagi, Kyoto (JP); Masashi Kanaoka, Kyoto (JP); Kazuhito Shigemori, Kyoto (JP); Shuichi Yasuda, Kyoto (JP); Masakazu Sanada, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 333 days.

(21) Appl. No.: 12/208,925

(22) Filed: Sep. 11, 2008

(65) Prior Publication Data
US 2009/0073394 A1    Mar. 19, 2009

(30) Foreign Application Priority Data

Sep. 13, 2007    (JP) .................................. 2007-237700

(51) Int. Cl.
*G03B 27/52* (2006.01)
(52) U.S. Cl. ........................................... 355/30; 134/33
(58) Field of Classification Search .................. 396/611; 355/27, 30, 53; 134/33, 94.1, 95.2, 95.3, 134/147, 148, 149
See application file for complete search history.

(56) References Cited

U.S. PATENT DOCUMENTS

| | | | |
|---|---|---|---|
| 6,893,171 B2 | 5/2005 | Fukutomi et al. | |
| 7,604,013 B2 * | 10/2009 | Nakamura et al. | 134/95.2 |
| 2003/0079764 A1 | 5/2003 | Hirose et al. | |
| 2006/0048792 A1 | 3/2006 | Nakamura et al. | |
| 2006/0159449 A1 | 7/2006 | Yasuda et al. | |
| 2006/0159499 A1 | 7/2006 | Watanabe et al. | |
| 2007/0003278 A1 | 1/2007 | Kaneyama | |
| 2007/0131256 A1 | 6/2007 | Nanba et al. | |
| 2007/0137677 A1 | 6/2007 | Nanba | |
| 2007/0267047 A1 | 11/2007 | Hori et al. | |
| 2008/0016714 A1 | 1/2008 | Kaneyama et al. | |

(Continued)

FOREIGN PATENT DOCUMENTS

CN    1786827 A    6/2006

(Continued)

OTHER PUBLICATIONS

Translation of Office Action of Korean Patent Application No. 10-2008-0087719 (dated Aug. 10, 2010).*

(Continued)

*Primary Examiner* — Peter B Kim
*Assistant Examiner* — Chia-how Michael Liu
(74) *Attorney, Agent, or Firm* — Kilpatrick Townsend & Stockton LLP

(57) ABSTRACT

After a substrate is cleaned, a liquid supply nozzle moves outward from above the center of the substrate while discharging a rinse liquid with the substrate rotated. In this case, a drying region where no rinse liquid exists expands on the substrate. When the liquid supply nozzle moves to above a peripheral portion of the substrate, the rotational speed of the substrate is reduced. The movement speed of the liquid supply nozzle is maintained as it is. Thereafter, the discharge of the rinse liquid is stopped while the liquid supply nozzle moves outward from the substrate. Thus, the drying region spreads over the whole substrate so that the substrate is dried.

15 Claims, 14 Drawing Sheets

U.S. PATENT DOCUMENTS

| | | |
|---|---|---|
| 2008/0053487 A1 | 3/2008 | Goto et al. |
| 2009/0074402 A1 | 3/2009 | Miyagi et al. |
| 2009/0272407 A1 | 11/2009 | Nakamura et al. |
| 2011/0155193 A1 | 6/2011 | Nanba et al. |

FOREIGN PATENT DOCUMENTS

| | | |
|---|---|---|
| CN | 1883035 A | 12/2006 |
| JP | 08-148459 A | 6/1996 |
| JP | WO 99/49504 | 9/1999 |
| JP | 2001-053051 A | 2/2001 |
| JP | 2002-057088 | 2/2002 |
| JP | 2002-367899 A | 12/2002 |
| JP | 2003-203892 A | 7/2003 |
| JP | 2003-324139 | 11/2003 |
| JP | 2004-335542 A | 11/2004 |
| JP | 2006-080315 | 3/2006 |
| JP | 2007-012997 A | 1/2007 |
| JP | 2007-311439 | 11/2007 |
| JP | 2008-016781 | 1/2008 |
| JP | 2008-060103 | 3/2008 |
| JP | 2008-060104 | 3/2008 |
| KR | 2003-0036087 A | 5/2003 |
| KR | 10-2007-0049658 A | 5/2007 |
| KR | 10-2007-0065214 A | 6/2007 |
| TW | 561516 B | 11/2003 |
| TW | I242808 B | 11/2005 |
| WO | 2005/050724 A1 | 6/2005 |

OTHER PUBLICATIONS

Office Action of Korean Patent Application No. 10-2008-0087719, mailed Jun. 10, 2010, 4 pages total.

Office Action of Chinese Application No. 2008102123797, mailed Jan. 22, 2010, 9 pages total.

Office Action for corresponding Japanese application No. 2007-237700 dated Feb. 14, 2012, 3 pages.

Office Action for corresponding Taiwanese application No. 097134498 dated Feb. 21, 2012, 6 pages.

* cited by examiner

F I G. 6
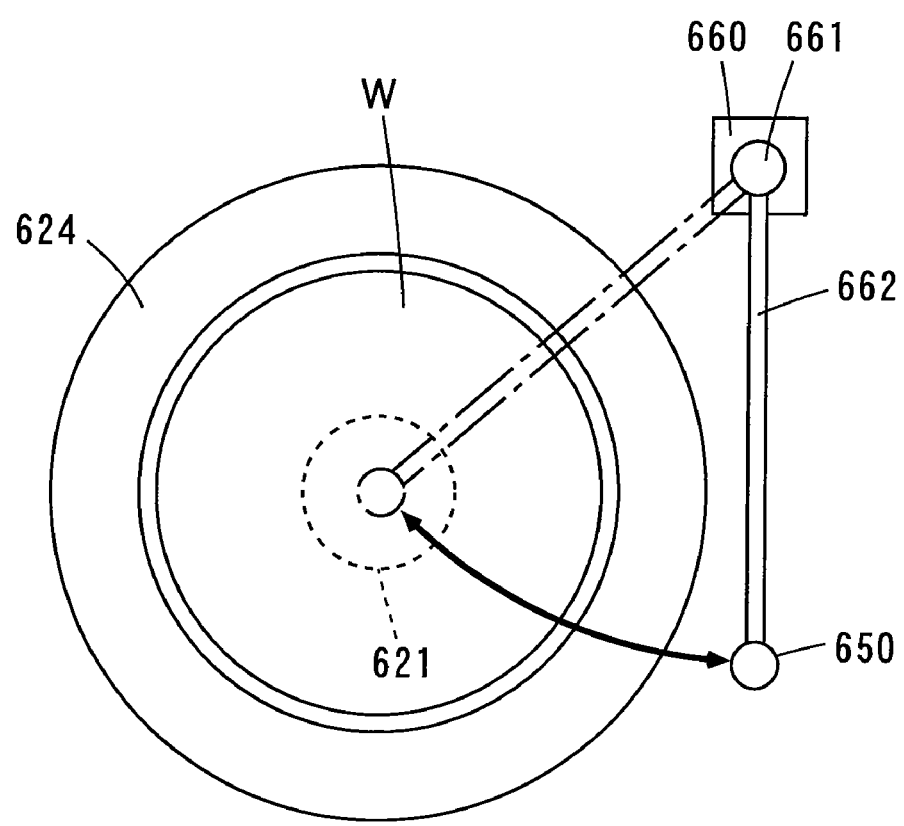

F I G. 9
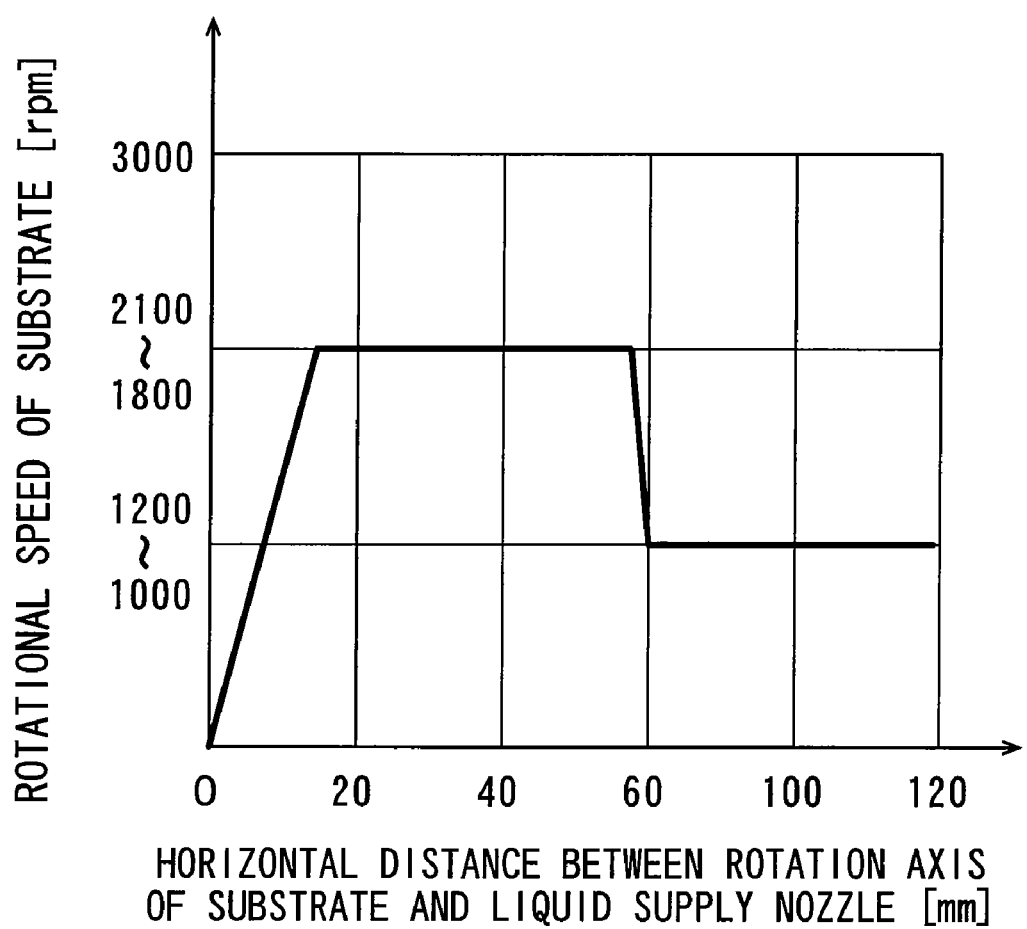

F I G. 1 1
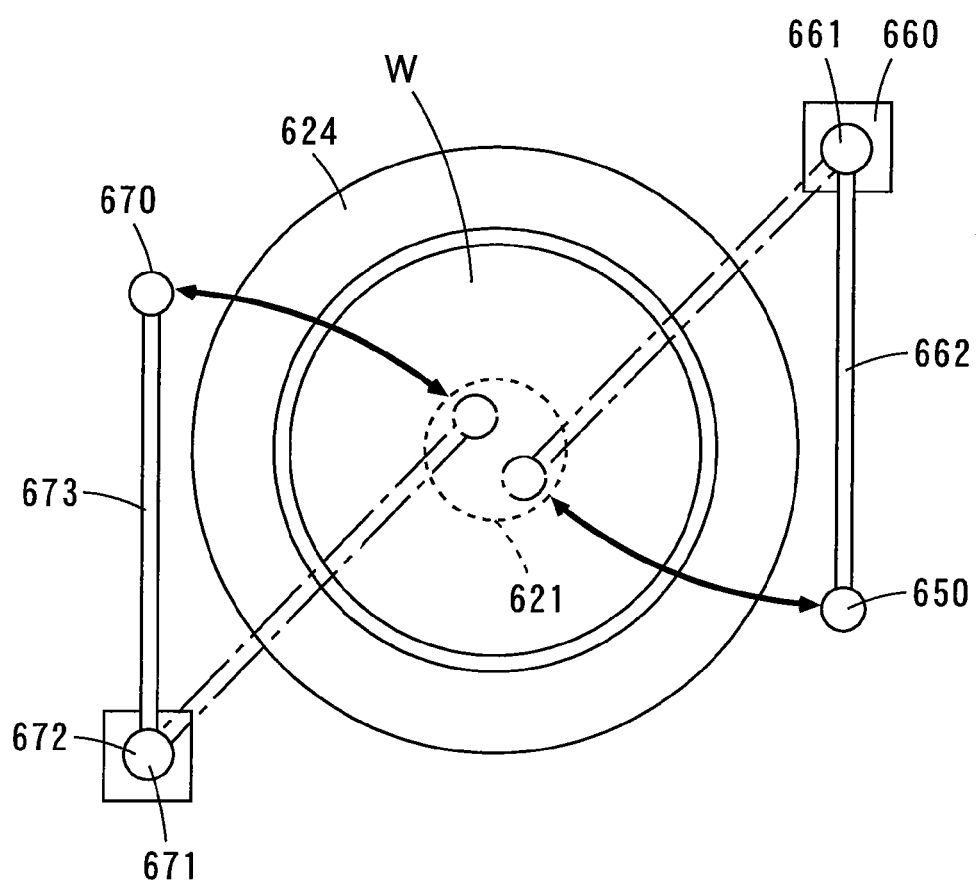

SUBSTRATE PROCESSING APPARATUS WITH MULTI-SPEED DRYING HAVING RINSE LIQUID SUPPLIER THAT MOVES FROM CENTER OF ROTATED SUBSTRATE TO ITS PERIPHERY AND STOPS TEMPORARILY SO THAT A DRYING CORE CAN FORM

CROSS-REFERENCES TO RELATED APPLICATIONS

This application claims priority to Japanese Patent Application 2007-237700, filed Sep. 13, 2007. The disclosure of JP 2007-237700 is hereby incorporated by reference its entirety for all purposes.

BACKGROUND OF THE INVENTION

1. Field of the Invention

The present invention relates to a substrate processing apparatus and a substrate processing method for subjecting substrates to predetermined processing.

2. Description of the Background Art

Substrate processing apparatuses are used to subject various types of substrates such as semiconductor substrates, substrates for liquid crystal displays, plasma displays, optical disks, magnetic disks, and magneto-optical disks, photomasks, and other substrates to various types of processing.

Such a substrate processing apparatus generally subjects a single substrate to a plurality of different types of processing successively. A substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried thereinto from the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by projecting reticle patterns on substrates through reduction-projection lenses. In such conventional exposure devices, however, the line widths of exposure patterns are determined by the wavelengths of light sources of the exposure devices. Therefore, making finer resist patterns has had limitations.

Therefore, a liquid immersion method is suggested as a projection exposure method allowing for finer exposure patterns (see, e.g., WO99/49504 pamphlet). In the projection exposure device according to the WO99/49504 pamphlet, an area between a projection optical system and a substrate is filled with a liquid, resulting in a shorter wavelength of exposure light on a top surface of the substrate. This allows for a finer exposure pattern.

In the projection exposure device according to the above-mentioned WO99/49504 pamphlet, however, exposure processing is performed with the substrate and the liquid brought into contact with each other. Thus, the substrate is carried out of the exposure device with the liquid adhering thereto. When the exposure device using the liquid immersion method as described in the above-mentioned WO99/49504 pamphlet is provided as an external device in the substrate processing apparatus according to the above-mentioned JP 2003-324139 A, the liquid adhering to the substrate that has been carried out of the exposure device may drop in the substrate processing apparatus, causing operational troubles such as abnormalities in an electric system of the substrate processing apparatus.

When the liquid adheres to the substrate that has been subjected to the exposure processing, particles and the like may easily adhere to the substrate, and the liquid that adheres to the substrate may, in some cases, adversely affect a film formed on the substrate. This may cause processing defects to occur in the substrate.

SUMMARY OF THE INVENTION

An object of the present invention is to provide a substrate processing apparatus and a substrate processing method in which operational troubles and processing defects due to a liquid that has adhered to a substrate in an exposure device are prevented.

According to an aspect of the present invention, a substrate processing apparatus that is arranged adjacent to an exposure device includes a processing section for subjecting a substrate to processing, and an interface for transferring and receiving the substrate between the processing section and the exposure device, in which at least one of the processing section and the interface includes a drying processing unit that subjects the substrate to drying processing, the drying processing unit includes a substrate holding device that holds the substrate substantially horizontally, a rotation-driving device that rotates the substrate held by the substrate holding device around an axis perpendicular to the substrate, a rinse liquid supplier that supplies a rinse liquid onto the substrate held by the substrate holding device, and a rinse liquid supplier moving mechanism that moves the rinse liquid supplier such that the rinse liquid is continuously supplied from the center of the rotated substrate to its peripheral portion, and the rotation-driving device gradually or continuously changes the rotational speed of the substrate such that the substrate is rotated at a first rotational speed with the rinse liquid supplied to the center of the substrate, and rotated at a second rotational speed lower than the first rotational speed with the rinse liquid supplied to the peripheral portion of the substrate.

In the substrate processing apparatus, the processing section subjects the substrate to the predetermined processing, and the interface transfers and receives the substrate from the processing section to the exposure device. After the exposure device subjects the substrate to the exposure processing, the interface transfers and receives the substrate from the exposure device to the processing section. Before or after the exposure processing by the exposure device, the drying processing unit subjects the substrate to the drying processing.

In the drying processing unit, the rotation-driving device rotates the substrate with the substrate held substantially horizontally by the substrate holding device. The rinse liquid supplier is moved by the rinse liquid supplier moving mechanism while supplying the rinse liquid to the substrate. This causes the rinse liquid to be continuously supplied from the center of the substrate to the peripheral portion thereof.

The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Here, the peripheral speed in the peripheral portion of the substrate is more than the peripheral speed at the center of the substrate. Therefore, the rinse liquid supplied to the peripheral portion of the substrate is scattered more easily than the rinse liquid supplied to the center of the substrate. Therefore, the substrate is rotated at the first rotational speed with the rinse liquid supplied to the center of the substrate, and rotated at a second rotational speed lower than the first rotational speed with the rinse liquid supplied to the peripheral portion of the substrate. In this case, the rinse liquid supplied to the peripheral portion of the substrate is prevented from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

According to another aspect of the present invention, a substrate processing apparatus that is arranged adjacent to an exposure device includes a processing section for subjecting a substrate to processing, and an interface for transferring and receiving the substrate between the processing section and the exposure device, in which at least one of the processing section and the interface includes a drying processing unit that subjects the substrate to drying processing, the drying processing unit includes a substrate holding device that holds the substrate substantially horizontally, a rotation-driving device that rotates the substrate held by the substrate holding device around an axis perpendicular to the substrate, a rinse liquid supplier that supplies a rinse liquid onto the substrate held by the substrate holding device, and a rinse liquid supplier moving mechanism that moves the rinse liquid supplier such that the rinse liquid is continuously supplied from the center of the rotated substrate to its peripheral portion, and the rinse liquid supplier gradually or continuously changes the flow rate of the rinse liquid such that the rinse liquid is supplied to the center of the substrate at a first flow rate, and supplied to the peripheral portion of the substrate at a second flow rate lower than the first flow rate.

In the substrate processing apparatus, the processing section subjects the substrate to the predetermined processing, and the interface transfers and receives the substrate from the processing section to the exposure device. After the exposure device subjects the substrate to the exposure processing, the interface transfers and receives the substrate from the exposure device to the processing section. Before or after the exposure processing by the exposure device, the drying processing unit subjects the substrate to the drying processing.

In the drying processing unit, the rotation-driving device rotates the substrate with the substrate held substantially horizontally by the substrate holding device. The rinse liquid supplier moves by the rinse liquid supplier moving mechanism while supplying the rinse liquid to the substrate. This causes the rinse liquid to be continuously supplied from the center of the substrate to the peripheral portion thereof.

The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Furthermore, the rinse liquid is supplied to the center of the substrate at the first flow rate, and supplied to the peripheral portion of the substrate at the second flow rate lower than the first flow rate. This prevents the rinse liquid supplied to the peripheral portion of the substrate from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

According to still another aspect of the present invention, a substrate processing apparatus that is arranged adjacent to an exposure device includes a processing section for subjecting a substrate to processing, and an interface for transferring and receiving the substrate between the processing section and the exposure device, in which at least one of the processing section and the interface includes a drying processing unit that subjects the substrate to drying processing, the drying processing unit includes a substrate holding device that holds the substrate substantially horizontally, a rotation-driving device that rotates the substrate held by the substrate holding device around an axis perpendicular to the substrate, a rinse liquid supplier that supplies a rinse liquid onto the substrate held by the substrate holding device, and a rinse liquid supplier moving mechanism that moves the rinse liquid supplier such that the rinse liquid is continuously supplied from the center of the rotated substrate to its peripheral portion, and the rinse liquid supplier gradually or continuously changes the supply pressure of the rinse liquid such that the rinse liquid is supplied to the center of the substrate at a first supply pressure, and supplied to the peripheral portion of the substrate at a second supply pressure lower than the first supply pressure.

In the substrate processing apparatus, the processing section subjects the substrate to the predetermined processing, and the interface transfers and receives the substrate from the processing section to the exposure device. After the exposure device subjects the substrate to the exposure processing, the interface transfers and receives the substrate from the exposure device to the processing section. Before or after the exposure processing by the exposure device, the drying processing unit subjects the substrate to the drying processing.

In the drying processing unit, the rotation-driving device rotates the substrate with the substrate held substantially horizontally by the substrate holding device. The rinse liquid supplier is moved by the rinse liquid supplier moving mechanism while supplying the rinse liquid to the substrate. This causes the rinse liquid to be continuously supplied from the center of the substrate to the peripheral portion thereof.

The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Furthermore, the rinse liquid is supplied to the center of the substrate at a first supply pressure, and supplied to the peripheral portion of the substrate at a second supply pressure lower than the first supply pressure. This prevents the rinse liquid supplied to the peripheral portion of the substrate from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

The rinse liquid supplier moving mechanism may temporarily stop the movement of the rinse liquid supplier with the rinse liquid supplied to a position spaced apart from the center of the substrate by a predetermined distance.

In this case, the liquid layer on the substrate is prevented from being divided into a plurality of portions, and one drying region can be reliably expanded from the center of the liquid layer. This makes it possible for the drying of the substrate to stably progress while more reliably preventing the minute droplets on the substrate from being formed.

The drying processing unit may further include a gas supplier that discharges gas to the center of the substrate with the rinse liquid supplied to a position spaced apart from the center of the substrate by the rinse liquid supplier.

In this case, immediately after the drying region is formed on the liquid layer on the substrate, the gas supplier discharges the gas to the center of the substrate, which allows the drying region to be instantaneously expanded. This can prevent the liquid layer on the substrate from being divided into a plurality of portions. Therefore, it is possible for the drying of the substrate to stably progress while more reliably preventing the minute droplets on the substrate from being formed.

The drying processing unit may further include a gas supplier moving mechanism that moves the gas supplier such that the position where the gas is supplied on the substrate moves from the center of the substrate to the peripheral portion of the substrate at a position closer to the center of the substrate than the position where the rinse liquid is supplied by the rinse liquid supplier.

In this case, the gas is discharged to the drying region on the substrate, which more reliably prevents the minute droplets from remaining within the drying region. Furthermore, the drying region can be reliably expanded, which allows the substrate to be efficiently and reliably dried.

The processing section may further include a photosensitive film formation unit that forms a photosensitive film composed of a photosensitive material on the substrate before the exposure processing, and a development processing unit that subjects the substrate after the exposure processing to development processing, and the drying processing unit may subject the substrate to the drying processing after the exposure processing by the exposure device and before the development processing by the development processing unit.

In this case, the liquid is prevented from remaining on the photosensitive film in a time period between the time the substrate is subjected to the exposure processing and the time it is subjected to the development processing. This prevents reaction that progresses by the photosensitive film after the exposure processing from being inhibited by the remaining liquid. Furthermore, an exposure pattern is prevented from being deformed by the remaining liquid. Therefore, processing defects such as reduction in line definition during the development processing are reliably prevented.

According to still another aspect of the present invention, a substrate processing method for processing a substrate in a substrate processing apparatus that is arranged adjacent to an exposure device and includes a processing section and an interface includes the steps of subjecting the substrate to processing before exposure processing by the processing section, transferring and receiving the substrate processed by the processing section from the processing section to the exposure device by the interface, transferring and receiving the substrate after the exposure processing by the exposure device from the exposure device to the processing section by the interface, subjecting the substrate to processing after the exposure processing by the processing section, and subjecting the substrate to drying processing in at least one of the processing section and the interface, in which the step of subjecting the substrate to the drying processing includes the steps of rotating the substrate around an axis perpendicular to the substrate while holding the substrate substantially horizontally, and continuously supplying the rinse liquid from the center of the rotated substrate to its peripheral portion, and the step of rotating the substrate includes the step of gradually or continuously changing the rotational speed of the substrate such that the substrate is rotated at a first rotational speed in a time period during which the rinse liquid is supplied to the center of the substrate, and rotated at a second rotational speed lower than the first rotational speed in a time period during which the rinse liquid is supplied to the peripheral portion of the substrate.

In the substrate processing method, the processing section subjects the substrate to the processing before the exposure processing, and the interface transfers and receives the substrate from the processing section to the exposure device. After the exposure device subjects the substrate to the exposure processing, the interface transfers and receives the substrate from the exposure device to the processing section, and the substrate is subjected to the processing after the exposure processing. Before or after the exposure processing by the exposure device, the drying processing unit subjects the substrate to the drying processing in at least one of the processing section and the interface.

During the drying processing, the substrate is rotated with the substrate held substantially horizontally. The rinse liquid is continuously supplied from the center of the rotated substrate to the peripheral portion thereof. The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Furthermore, the substrate is rotated at the first rotational speed with the rinse liquid supplied to the center of the substrate, and rotated at the second rotational speed lower than the first rotational speed with the rinse liquid supplied to the peripheral portion of the substrate. This prevents the rinse liquid supplied to the peripheral portion of the substrate from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

According to still another aspect of the present invention, a substrate processing method for processing a substrate in a substrate processing apparatus that is arranged adjacent to an exposure device and includes a processing section and an interface includes the steps of subjecting the substrate to processing before exposure processing by the processing section, transferring and receiving the substrate processed by the processing section from the processing section to the exposure device by the interface, transferring and receiving the substrate after the exposure processing by the exposure device from the exposure device to the processing section by the interface, subjecting the substrate to processing after the exposure processing by the processing section, and subjecting the substrate to drying processing in at least one of the processing section and the interface, in which the step of subjecting the substrate to the drying processing includes the steps of rotating the substrate around an axis perpendicular to the substrate while holding the substrate substantially horizontally, and continuously supplying the rinse liquid from the center of the rotated substrate to its peripheral portion, and the step of supplying the rinse liquid includes the step of gradually or continuously changing the flow rate of the rinse liquid such that the rinse liquid is supplied to the center of the substrate at a first flow rate, and supplied to the peripheral portion of the substrate at a second flow rate lower than the first flow rate.

In the substrate processing method, the processing section subjects the substrate to the processing before the exposure processing, and the interface transfers and receives the substrate from the processing section to the exposure device. After the exposure device subjects the substrate to the exposure processing, the interface transfers and receives the substrate from the exposure device to the processing section, and the substrate is subjected to the processing after the exposure processing. Before or after the exposure processing by the exposure device, the drying processing unit subjects the substrate to the drying processing in at least one of the processing section and the interface.

During the drying processing, the substrate is rotated with the substrate held substantially horizontally. The rinse liquid is continuously supplied from the center of the rotated substrate to the peripheral portion thereof. The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Furthermore, the rinse liquid is supplied to the center of the substrate at the first flow rate, and supplied to the peripheral portion of the substrate at the second flow rate lower than the first flow rate. This prevents the rinse liquid supplied to the peripheral portion of the substrate from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

According to still another aspect of the present invention, a substrate processing method for processing a substrate in a substrate processing apparatus that is arranged adjacent to an exposure device and includes a processing section and an interface includes the steps of subjecting the substrate to processing before exposure processing by the processing section, transferring and receiving the substrate processed by the processing section from the processing section to the exposure device by the interface, transferring and receiving the substrate after the exposure processing by the exposure device from the exposure device to the processing section by the interface, subjecting the substrate to processing after the exposure processing by the processing section, and subjecting the substrate to drying processing in at least one of the processing section and the interface, in which the step of subjecting the substrate to the drying processing includes the steps of rotating the substrate around an axis perpendicular to the substrate while holding the substrate substantially horizontally, and continuously supplying the rinse liquid from the center of the rotated substrate to its peripheral portion, and the step of supplying the rinse liquid includes the step of gradually or continuously changing the supply pressure of the rinse liquid such that the rinse liquid is supplied to the center of the substrate at a first supply pressure, and supplied to the peripheral portion of the substrate at a second supply pressure lower than the first supply pressure.

In the substrate processing method, the processing section subjects the substrate to the processing before the exposure processing, and the interface transfers and receives the substrate from the processing section to the exposure device. After the exposure device subjects the substrate to the exposure processing, the interface transfers and receives the substrate from the exposure device to the processing section, and the substrate is subjected to the processing after the exposure processing. Before or after the exposure processing by the exposure device, the drying processing unit subjects the substrate to the drying processing in at least one of the processing section and the interface.

During the drying processing, the substrate is rotated with the substrate held substantially horizontally. The rinse liquid is continuously supplied from the center of the rotated substrate to the peripheral portion thereof. The rinse liquid is supplied to the center of the rotated substrate so that a liquid layer of the rinse liquid is formed on the substrate. Then, the position where the rinse liquid is supplied on the substrate moves from the center of the substrate to the peripheral portion thereof. This causes a drying region where no rinse liquid exists to be formed at the center of the liquid layer. Thereafter, the drying region expands outward from the center of the liquid layer by a centrifugal force with the liquid layer integrally held in an annular shape on the substrate. In this case, the surface tension of the liquid layer prevents minute droplets from being formed within the drying region.

Furthermore, the rinse liquid is supplied to the center of the substrate at the first supply pressure, and supplied to the peripheral portion of the substrate at the second supply pressure lower than the first supply pressure. This prevents the rinse liquid supplied to the peripheral portion of the substrate from being scattered. Therefore, it is possible to prevent the scattered rinse liquid from adhering to the inside of the drying region of the substrate again while reliably preventing the minute droplets from remaining on the substrate.

In a case where the substrate after the exposure processing is subjected to such drying processing, even if the liquid adheres to the substrate in the exposure device, the liquid can be prevented from dropping in the substrate processing apparatus. As a result, operational troubles in the substrate processing apparatus can be prevented.

Particles and the like in an atmosphere are prevented from adhering to the liquid remaining on the substrate. Furthermore, the liquid remaining on the substrate is prevented from adversely affecting a film on the substrate. Therefore, processing defects in the substrate can be prevented.

On the other hand, when the substrate before the exposure processing is subjected to the drying processing, the liquid layer is formed on the substrate, which allows the particles and the like that have adhered to the substrate in a processing process before the exposure processing to be removed before the exposure processing. As a result, contamination in the exposure device can be prevented, which can prevent the processing defects in the substrate.

Other features, elements, characteristics, and advantages of the present invention will become more apparent from the following description of embodiments of the present invention with reference to the attached drawings.

BRIEF DESCRIPTION OF THE DRAWINGS

FIG. 6 is a schematic plan view of the cleaning/drying processing unit shown in FIG. 5;

FIG. 9 is a diagram showing an example of the change in the rotational speed of a substrate;

FIG. 11 is a schematic plan view of the cleaning/drying processing unit shown in FIG. 9;

DETAILED DESCRIPTION OF THE INVENTION

Substrate processing apparatuses according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing Apparatus

Figure 1:
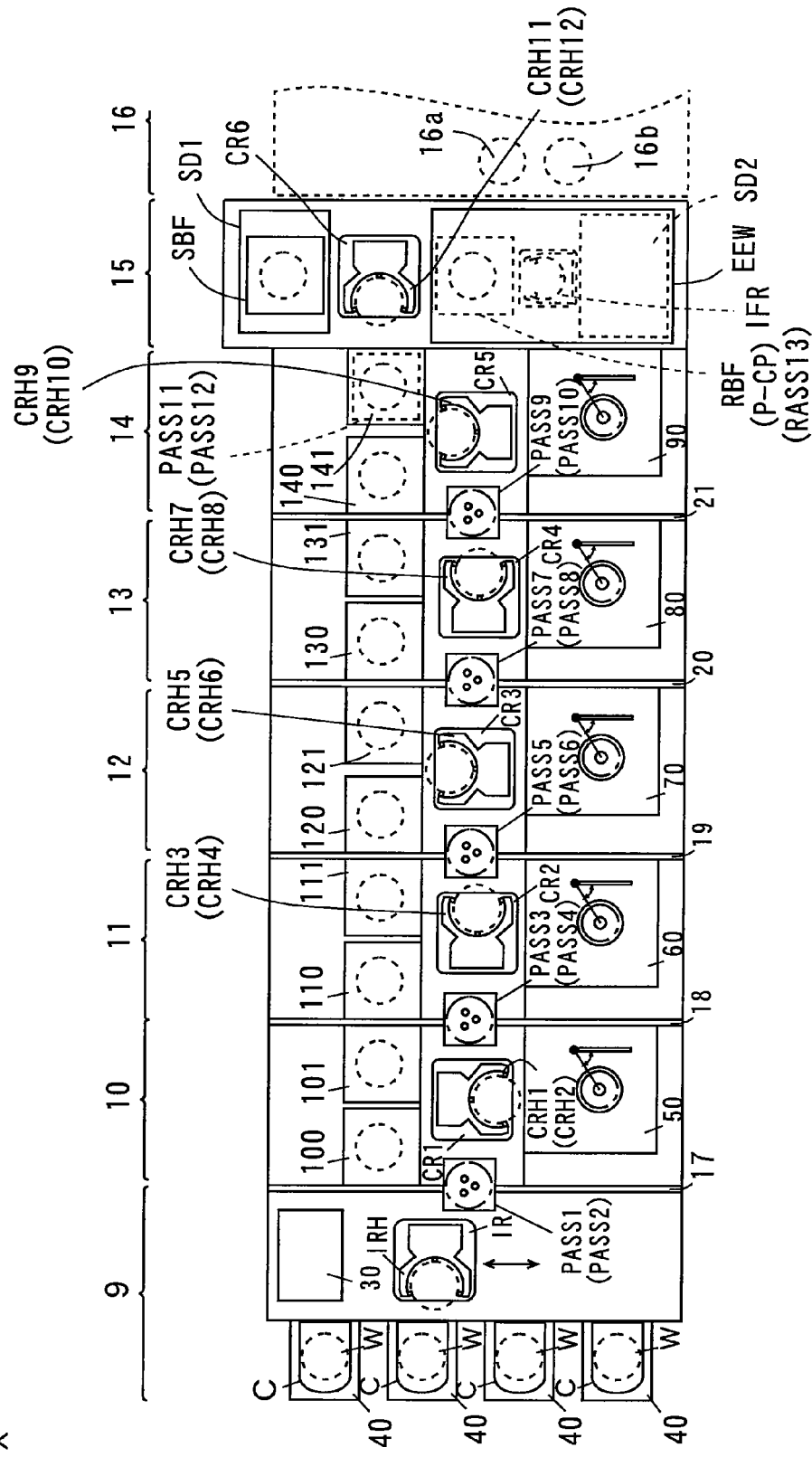
FIG. 1 is a plan view of a substrate processing apparatus according to a first embodiment of the present invention.

FIG. 1 is a plan view of a substrate processing apparatus according to an embodiment of the present invention. FIG. 1 and FIGS. 2 to 4 described later are accompanied by arrows that respectively indicate X, Y, and Z directions perpendicular to one another for clarity of a positional relationship. The X and Y directions are perpendicular to each other within a horizontal plane, and the Z direction corresponds to the vertical direction. In each of the directions, the direction of the arrow is defined as a + direction, and the opposite direction is defined as a − direction. A rotation direction centered around the Z direction is defined as a θ direction.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 that controls the operation of each of the processing blocks, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination whether or not the substrate W is placed on the substrate platform PASS1 or PASS2. Furthermore, each of the substrate platforms PASS1 and PASS2 has a plurality of support pins secured thereto. Note that each of substrate platforms PASS3 to PASS13 described later is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described later. The removal processing group 90 is opposed to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a sending buffer unit SBF, cleaning/drying processing units SD1, a sixth central robot CR6, an edge exposure unit EEW, a return buffer unit RBF, placement/cooling units PASS-CP (hereinafter abbreviated as P-CP), a substrate platform PASS13, an interface transport mechanism IFR, and cleaning/drying processing units SD2. The cleaning/drying processing unit SD1 subjects the substrate W before exposure processing to cleaning and drying processing, and the cleaning/drying processing SD2 subjects the substrate W after exposure processing to cleaning and drying processing. The details of the cleaning/drying processing units SD1 and SD2 will be described later.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
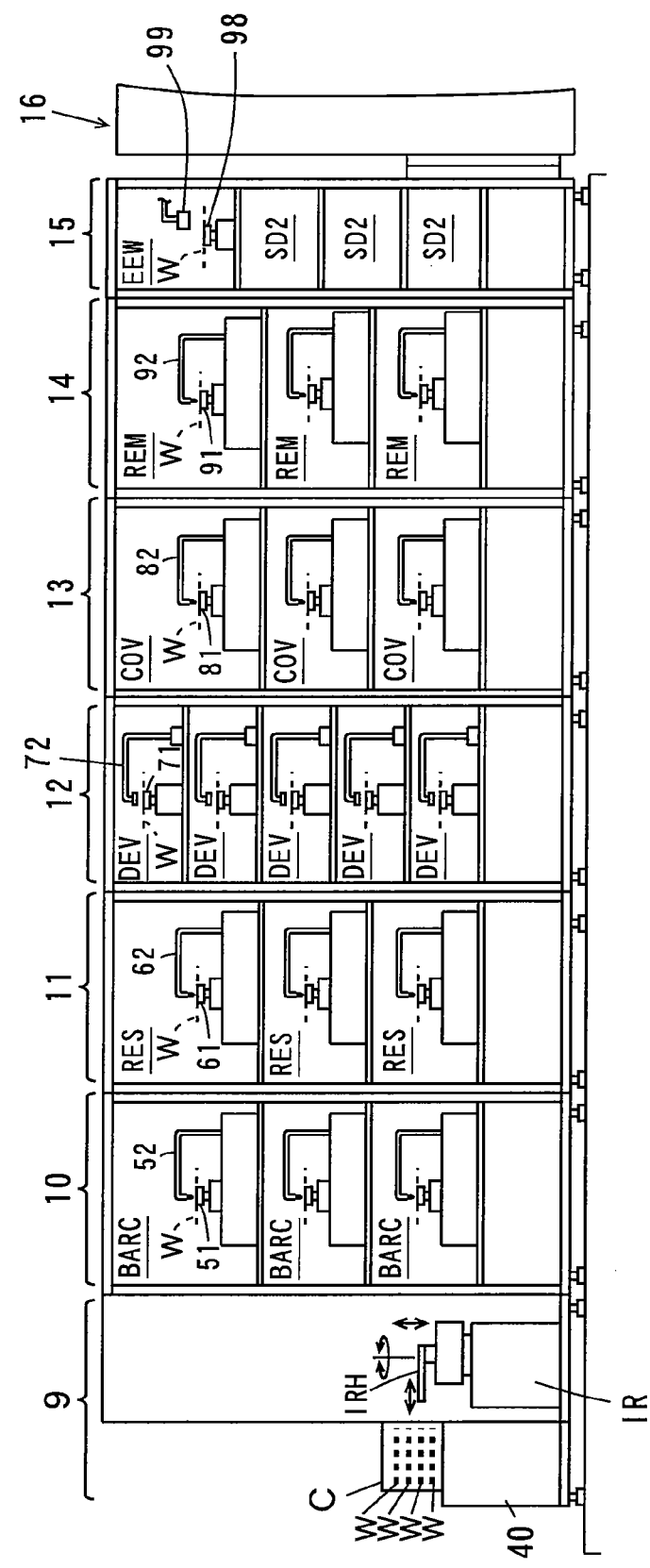
FIG. 2 is a schematic side view of the substrate processing apparatus shown in FIG. 1 as viewed from the +X direction.
Figure 3:
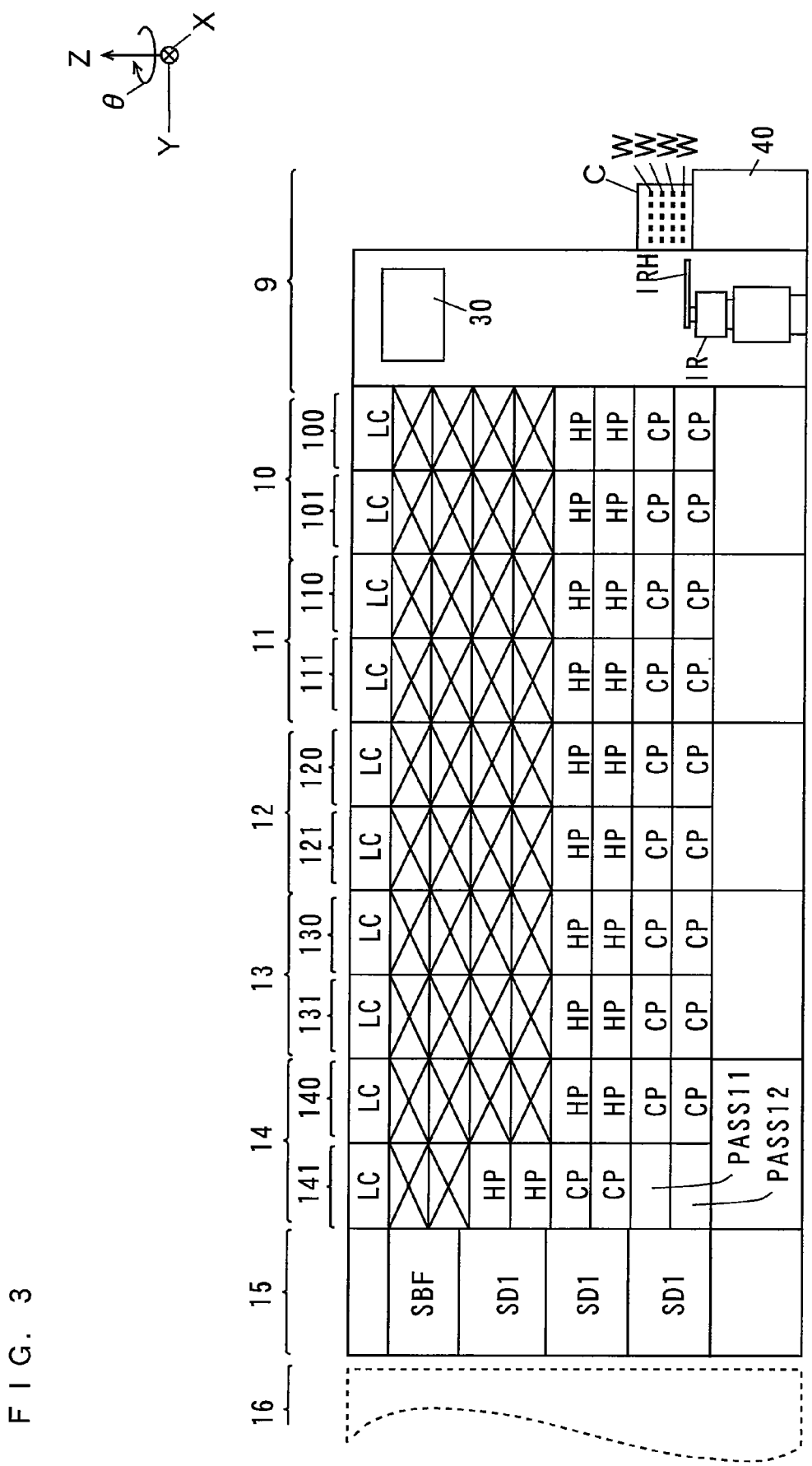
FIG. 3 is a schematic side view of the substrate processing apparatus shown in FIG. 1 as viewed from the −X direction.

FIG. 2 is a schematic side view of the substrate processing apparatus 500 shown in FIG. 1 as viewed from the +X direction, and FIG. 3 is a schematic side view of the substrate processing apparatus 500 shown in FIG. 1 as viewed from the −X direction. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2.

As shown in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g. fluororesin) to the substrate W held on the spin chuck 91. Each of the removal units REM removes the resist cover film formed on the substrate W by applying the stripping liquid onto the substrate W while rotating the substrate W.

Note that a method of removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of an edge exposure unit EEW and three cleaning/drying processing units SD2 on the +X side. The edge exposure unit EEW includes a spin chuck 98 for rotating the substrate W with the substrate held in a horizontal attitude by suction, and a light irradiator 99 for exposing a peripheral portion of the substrate W held on the spin chuck 98.

Description is now made of the configuration on the −X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

Figure 4:
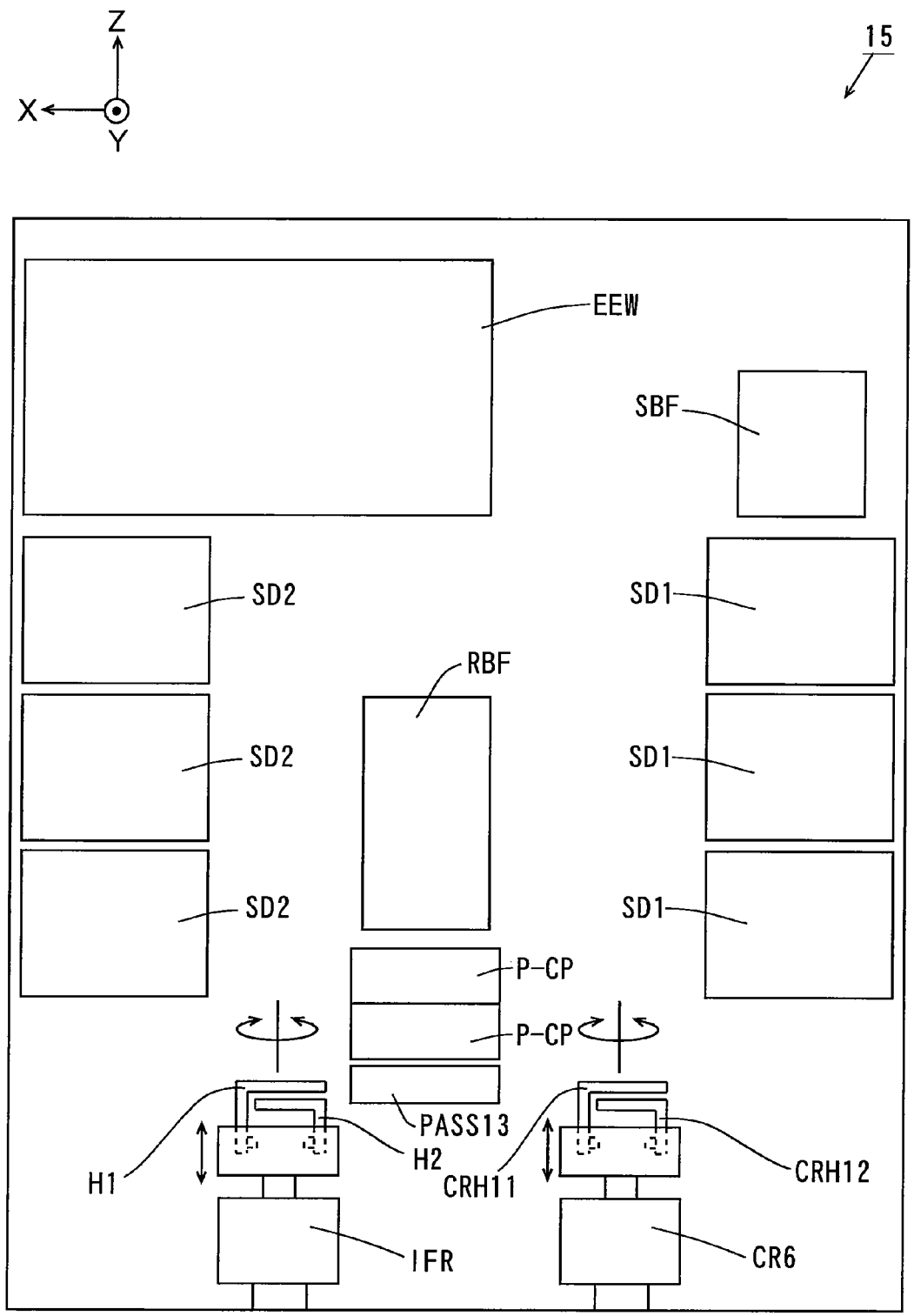
FIG. 4 is a schematic side view of an interface block as viewed from the +Y side.

The interface block 15 will be then described in detail using FIG. 4.

FIG. 4 is a schematic side view of the interface block 15 as viewed from the +Y side. As shown in FIG. 4, the interface block 15 has a stack of the sending buffer unit SBF and the three cleaning/drying processing units SD1 on the –X side. The interface block 15 has an edge exposure unit EEW arranged on the +X side in its upper part.

The interface block 15 has a vertical stack of a return buffer unit RBF, two placement/cooling units P-CP, and a substrate platform PASS13 at its substantially central portion below the edge exposure unit EEW. The interface block 15 has a vertical stack of three cleaning/drying processing units SD2 arranged on the +X side below the edge exposure unit EEW.

A sixth central robot CR6 and an interface transport mechanism IFR are provided in a lower part of the interface block 15. The sixth central robot CR6 is provided so as to be vertically movable and rotatable in an area among the sending buffer unit SBF, the cleaning/drying processing units SD1, the edge exposure unit EEW, the return buffer unit RBF, the placement/cooling units P-CP, and the substrate platform PASS13. The interface transport mechanism IFR is provided so as to be vertically movable and rotatable in an area among the return buffer unit RBF, the placement/cooling units P-CP, the substrate platform PASS13, and the cleaning/drying processing units SD2.

(2) Operation of Substrate Processing Apparatus

The operation of the substrate processing apparatus 500 according to the present embodiment will be then described with reference to FIGS. 1 to 4.

(2-1) Operations of Indexer Block to Resist Cover Film Removal Block

First, the operations of the indexer block 9 to the resist cover film removal block 14 will be briefly described.

Carriers C that store a plurality of substrates W in a multiple stage are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film. The formation of the resist cover film prevents the resist film from coming into contact with the liquid even if the substrate W comes into contact with the liquid in the exposure device 16 while preventing a component of a resist from being eluded in the liquid.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the resist cover film is removed.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the cleaning/drying processing units SD1. In the cleaning/drying processing unit SD1, the substrate W before the exposure processing is subjected to cleaning and drying processing, as described above.

Here, a time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF (FIG. 4). In the present embodiment, the sixth central robot CR6 takes out the substrate W after the cleaning and drying processing from the cleaning/drying processing unit SD1 and transports the substrate W to the sending buffer unit SBF.

The sixth central robot CR6 then takes out the substrate W stored in the sending buffer unit SBF and carries the substrate W into the placement/cooling unit P-CP. The substrate W carried into the placement/cooling unit P-CP is kept at the same temperature as that in the exposure device 16 (for example, 23° C.).

In a case where the exposure device 16 has a sufficient processing speed, the substrate W need not be stored in the sending buffer unit SBF but may be transported to the placement/cooling unit P-CP from the cleaning/drying processing unit SD1.

The substrate W kept at the above-mentioned predetermined temperature in the placement/cooling unit P-CP is then received with the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) with the lower hand H2 of the interface transport mechanism IFR (FIG. 4). The interface transport mechanism IFR carries the substrate W into any one of the cleaning/drying processing units SD2 with the hand H2. In the cleaning/drying processing unit SD2, the substrate W after the exposure processing is subjected to cleaning and drying processing, as described above.

The substrate W that has been subjected to the cleaning and drying processing in the cleaning/drying processing unit SD2 is taken out with the hand H1 of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

Note that when the resist cover film removal block 14 cannot temporarily receive the substrate W due to a failure or the like in the removal unit REM (FIG. 2), the substrate W after the exposure processing can be temporarily stored in the return buffer unit RBF.

Here, although in the present embodiment, the sixth central robot CR6 transports the substrate W among the substrate platform PASS11 (FIG. 1), the edge exposure unit EEW, the cleaning/drying processing units SD1, the sending buffer unit SBF, the placement/cooling units P-CP, the substrate platform PASS13, and the thermal processing group 141, a series of such operations can be performed in a short time (e.g., 24 seconds).

Although the interface transport mechanism IFR transports the substrate W among the placement/cooling units P-CP, the exposure device 16, the cleaning/drying processing units SD2, and the substrate platform PASS13, a series of such operations can be performed in a short time (e.g., 24 seconds).

As a result of these, throughput can be reliably improved.

(3) Cleaning/Drying Processing Unit

The cleaning/drying processing units SD1 and SD2 will be then described in detail with reference to the drawings. Note that usable as the cleaning/drying processing units SD1 and SD2 are ones having the same configuration.

(3-1) Configuration

Figure 5:
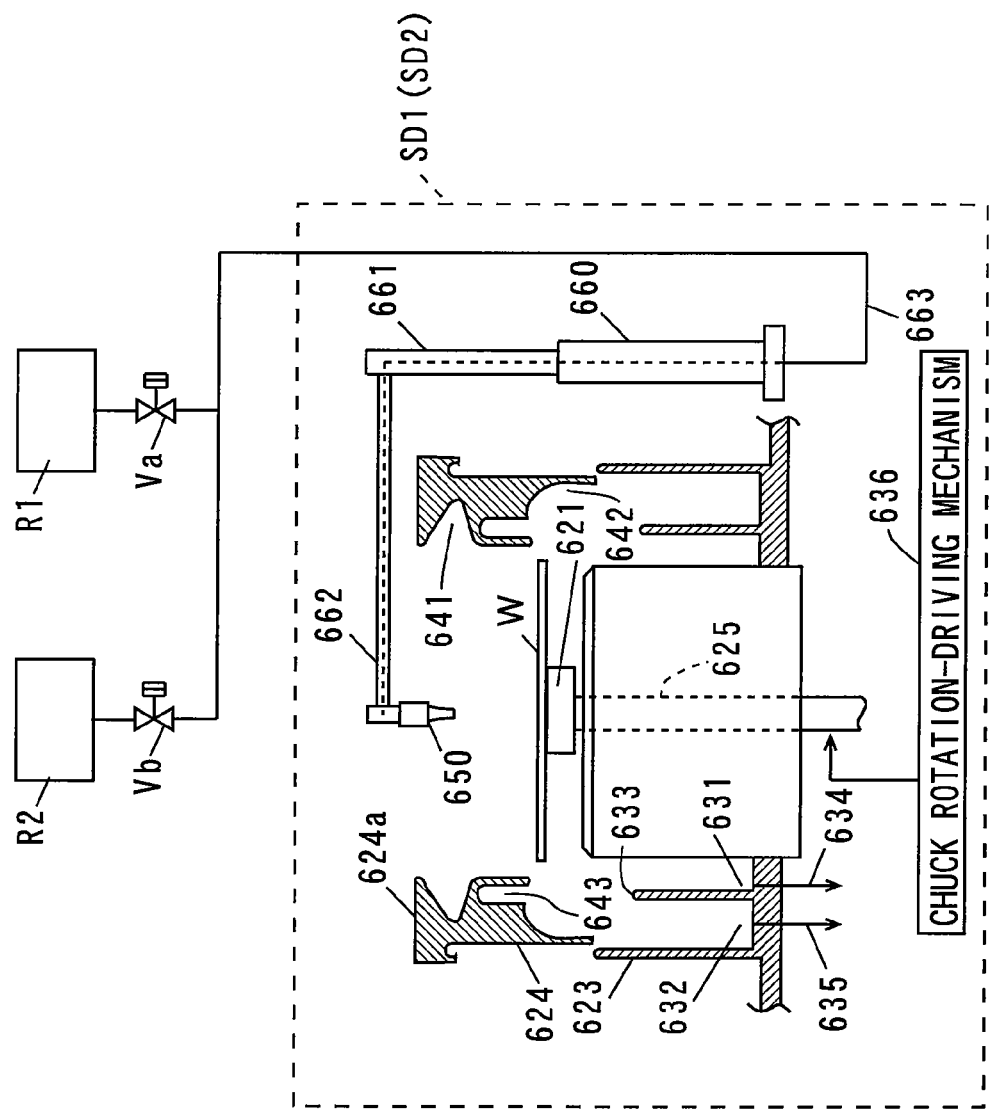
FIG. 5 is a diagram for explaining the configuration of a cleaning/drying processing unit.

FIG. 5 is a schematic side view showing the configuration of the cleaning/drying processing units SD1 and SD2, and FIG. 6 is a schematic plan view of the cleaning/drying processing units SD1 and SD2 shown in FIG. 5. As shown in FIGS. 5 and 6, each of the cleaning/drying processing units SD1 and SD2 includes a spin chuck 621 for holding the substrate W horizontally while rotating the substrate W around its vertical rotation axis passing through the center of the substrate W.

The spin chuck 621 is secured to an upper end of a rotating shaft 625 (FIG. 5) that is rotated by a chuck rotation-driving mechanism 636 (FIG. 5). Furthermore, a suction path (not shown) is formed in the spin chuck 621. By evacuating the suction path with the substrate W placed on the spin chuck 621 to adsorb a lower surface of the substrate W to the spin chuck 621 under vacuum, the substrate W can be held in a horizontal attitude.

A motor 660 is provided outside the spin chuck 621. A rotating shaft 661 is connected to the motor 660. Furthermore, an arm 662 is connected to the rotating shaft 661 so as to extend in the horizontal direction, and its tip is provided with a liquid supply nozzle 650.

The motor 660 causes the rotating shaft 661 to rotate while causing the arm 662 to rotate. This causes the liquid supply nozzle 650 to move between a position above the center of the substrate W held on the spin chuck 621 and a position outside the substrate W (FIG. 6).

A supply pipe 663 for cleaning processing is provided so as to pass through the motor 660, the rotating shaft 661, and the arm 662. The supply pipe 663 is connected to a cleaning liquid supply source R1 and a rinse liquid supply source R2 through a valve Va and a valve Vb, respectively.

By controlling the opening and closing of the valves Va and Vb, it is possible to select a processing liquid to be supplied to the supply pipe 663 and adjust the supply amount of the processing liquid. In the configuration shown in FIG. 5, a cleaning liquid can be supplied to the supply pipe 663 by opening the valve Va, and a rinse liquid can be supplied to the supply pipe 663 by opening the valve Vb.

The cleaning liquid or the rinse liquid is supplied to the liquid supply nozzle 650 through the supply pipe 663 from the cleaning liquid supply source R1 or the rinse liquid supply source R2, respectively. This allows the cleaning liquid or the rinse liquid to be supplied to a top surface of the substrate W. Examples of the cleaning liquid include pure water, a pure water solution containing a complex (ionized), or a fluorine-based chemical solution. Examples of the rinse liquid include pure water, carbonated water, hydrogen water, electrolytic ionic water, HFE (hydrofluoroether), and an organic-based liquid.

Furthermore, also usable as the cleaning liquid or the rinse liquid may be an immersion liquid used in the case of exposure processing in the exposure device 16. Examples of the immersion liquid include pure water, glycerol having a high refractive index, a liquid mixture of fine particles (e.g., aluminum oxide) having a high refractive index and pure water, and an organic-based liquid. Other examples of the immersion liquid include a pure water solution containing a complex (ionized), carbonated water, hydrogen water, electrolytic ionic water, HFE (hydrofluoroether), hydrofluoric acid, sulfuric acid, and sulfuric hyperhydration.

As shown in FIG. 5, the substrate W held on the spin chuck 621 is stored in a processing cup 623. A cylindrical partition wall 633 is provided inside the processing cup 623. A discharge space 631 for discharging the processing liquid (i.e., cleaning liquid or rinse liquid) used for processing the substrate W is formed so as to surround the spin chuck 621. Furthermore, a liquid recovery space 632 for recovering the processing liquid used for processing the substrate W is formed between the processing cup 623 and the partition wall 633 so as to surround the discharge space 631.

A discharge pipe 634 for introducing the processing liquid into a liquid discharge processing device (not shown) is connected to the discharge space 631, and a recovery pipe 635 for introducing the processing liquid into a recovery processing device (not shown) is connected to the liquid recovery space 632.

A guard 624 is provided above the processing cup 623 for preventing the processing liquid on the substrate W from being scattered outward. The guard 624 is shaped to be rotationally-symmetric with respect to the rotating shaft 625. A liquid discharge guide groove 641 with a V-shaped cross section is formed in an annular shape inwardly at an upper end of the guard 624.

Furthermore, a liquid recovery guide 642 having an inclined surface that is inclined outwardly downward is formed inwardly at a lower end of the guard 624. A partition wall housing groove 643 for receiving the partition wall 633 in the processing cup 623 is formed in the vicinity of an upper end of the liquid recovery guide 642.

The guard 624 is provided with a guard lifting mechanism (not shown) composed of a ball-screw mechanism or the like. The guard lifting mechanism moves the guard 624 upward and downward between a recovery position where the liquid recovery guide 642 is opposed to outer edges of the substrate W held on the spin chuck 621 and a discharge position where the liquid discharge guide groove 641 is opposed to the outer edges of the substrate W held on the spin chuck 621. When the guard 624 is in the recovery position (i.e., the position of the guard 624 shown in FIG. 5), the processing liquid scattered outward from the substrate W is introduced into the liquid recovery space 632 by the liquid recovery guide 642, and is recovered through the recovery pipe 635. On the other hand, when the guard 624 is in the discharge position, the processing liquid scattered outward from the substrate W is introduced into the discharge space 631 by the liquid discharge guide groove 641, and is discharged through the discharge pipe 634. The foregoing configuration causes the processing liquid to be discharged and recovered.

(3-2) Operation

The processing operation of the cleaning/drying processing units SD1 and SD2 having the above-mentioned configuration will be then described. Note that the operation of each of constituent elements in the cleaning/drying processing units SD1 and SD2 described below is controlled by the main controller (controller) 30 shown in FIG. 1.

When the substrate W is first carried into the cleaning/drying processing unit, the guard 624 is lowered, and the sixth central robot CR6 or the interface transport mechanism IFR shown in FIG. 1 places the substrate W on the spin chuck 621. The substrate W placed on the spin chuck 621 is held therein by suction.

Then, the guard 624 moves to the above-mentioned discharge position while the liquid supply nozzle 650 moves to above the center of the substrate W. Thereafter, the rotating shaft 625 rotates, which causes the substrate W held on the spin chuck 621 to rotate. Thereafter, the cleaning liquid is discharged onto an upper surface of the substrate W from the liquid supply nozzle 650. This causes the substrate W to be cleaned.

In the cleaning/drying processing unit SD1, a component of the resist cover film on the substrate W is eluted in the cleaning liquid during the cleaning. In the cleaning of the substrate W, the cleaning liquid is supplied onto the substrate W while the substrate W is being rotated. In this case, the cleaning liquid on the substrate W is always moved toward a peripheral portion of the substrate W by a centrifugal force and scattered. Therefore, the component of the resist cover film that has been eluted in the cleaning liquid can be prevented from remaining on the substrate W.

Note that the component of the resist cover film may be eluted with pure water poured onto the substrate W and held thereon for a certain time period, for example. Alternatively, the cleaning liquid may be supplied onto the substrate W by means of a soft discharge method using a two-fluid nozzle.

After an elapse of a predetermined time period, the supply of the cleaning liquid is stopped, and the rinse liquid is discharged from the liquid supply nozzle 650. This causes the cleaning liquid on the substrate W to be washed away. Thereafter, the rinse liquid on the substrate W is removed by drying processing, described later, which causes the substrate W to be dried. The details will be described later.

Thereafter, the guard 624 is lowered while the sixth central robot CR6 or the interface transport mechanism IFR shown in FIG. 1 carries the substrate W out of the cleaning/drying processing unit. This causes the processing operation in the cleaning/drying processing units SD1 and SD2 to be terminated. Note that it is preferable that the position of the guard 624 during the cleaning and drying processing is changed, as needed, according to the necessity of recovering or discharging the processing liquid.

Although in the above-mentioned embodiment, a configuration in which the liquid supply nozzle 650 is shared between the supply of the cleaning liquid and the supply of the rinse liquid is adopted such that both the cleaning liquid and the rinse liquid can be supplied from the liquid supply nozzle 650, a configuration in which different nozzles are respectively used for the supply of the cleaning liquid and the supply of the rinse liquid may be also adopted.

When pure water is used as the cleaning liquid for cleaning the substrate W, drying processing, described later, may be performed using the cleaning liquid.

When the substrate is slightly contaminated, the necessity of cleaning using the cleaning liquid is eliminated. In this case, a contaminant on the substrate W can be sufficiently removed by performing drying processing using a rinse liquid, described below.

(3-3) Details of Drying Processing for Substrate

The drying processing for the substrate W in the cleaning/drying processing units SD1 and SD2 will be described in detail below. It is assumed that the diameter of the substrate W used in this example is 200 to 300 mm, for example.

When the substrate W is dried utilizing a centrifugal force, minute droplets may easily remain on the substrate W. The reason for this is that the minute droplets are difficult to separate from the substrate W because a small centrifugal force corresponding to the mass thereof is only exerted thereon. When the minute droplets exist in the vicinity of the center of the substrate W, the minute droplets are more difficult to remove because the centrifugal force exerted on the minute droplets is further reduced. When the hydrophobic properties of the resist cover film on the substrate W are high, such minute droplets are particularly easy to form.

In the present embodiment, the minute droplets are prevented from being formed and adhering on the substrate W, and the rinse liquid on the substrate W is reliably removed.

Figure 7:
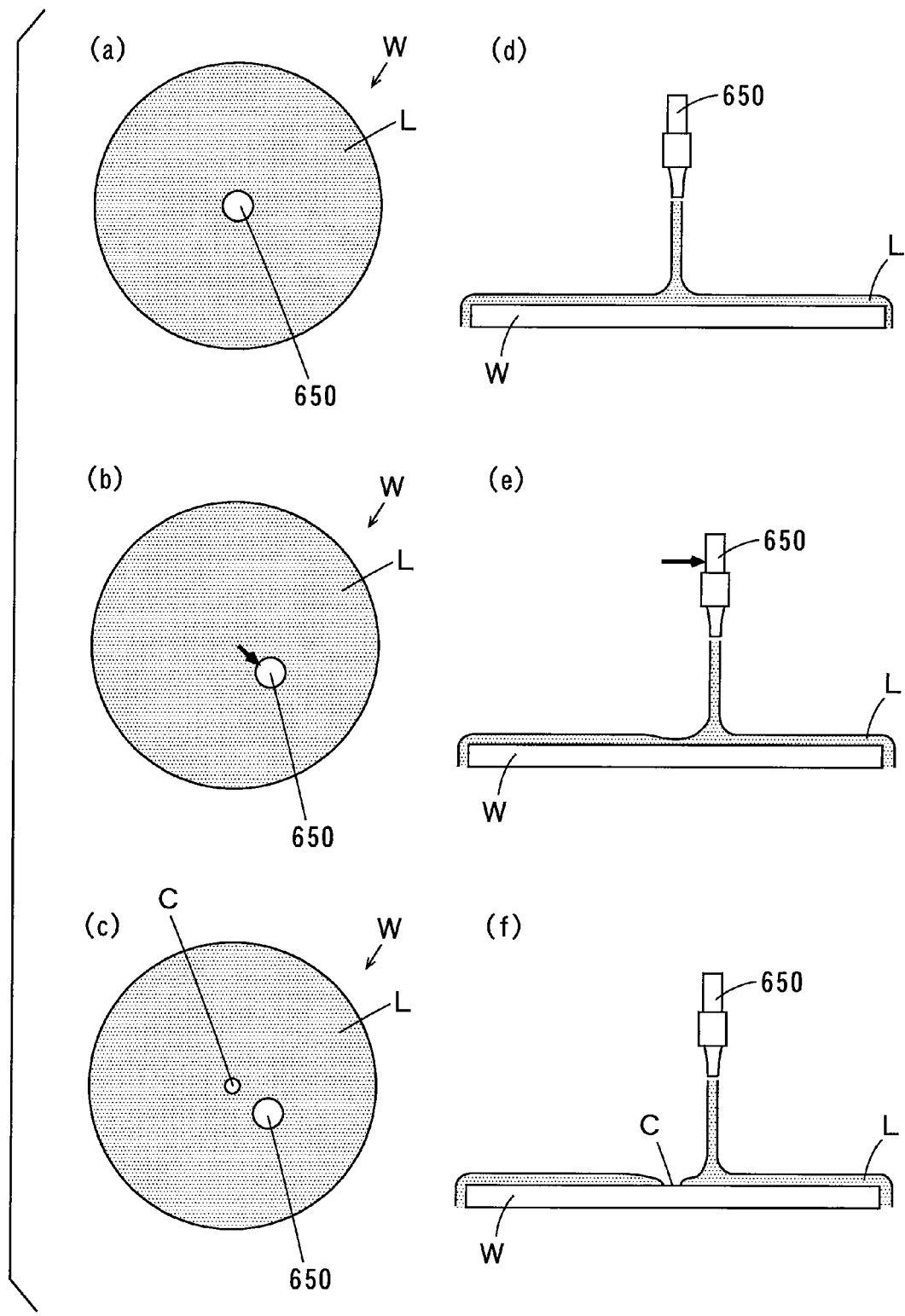
FIG. 7 is a diagram for explaining the details of drying processing for a substrate.
Figure 8:
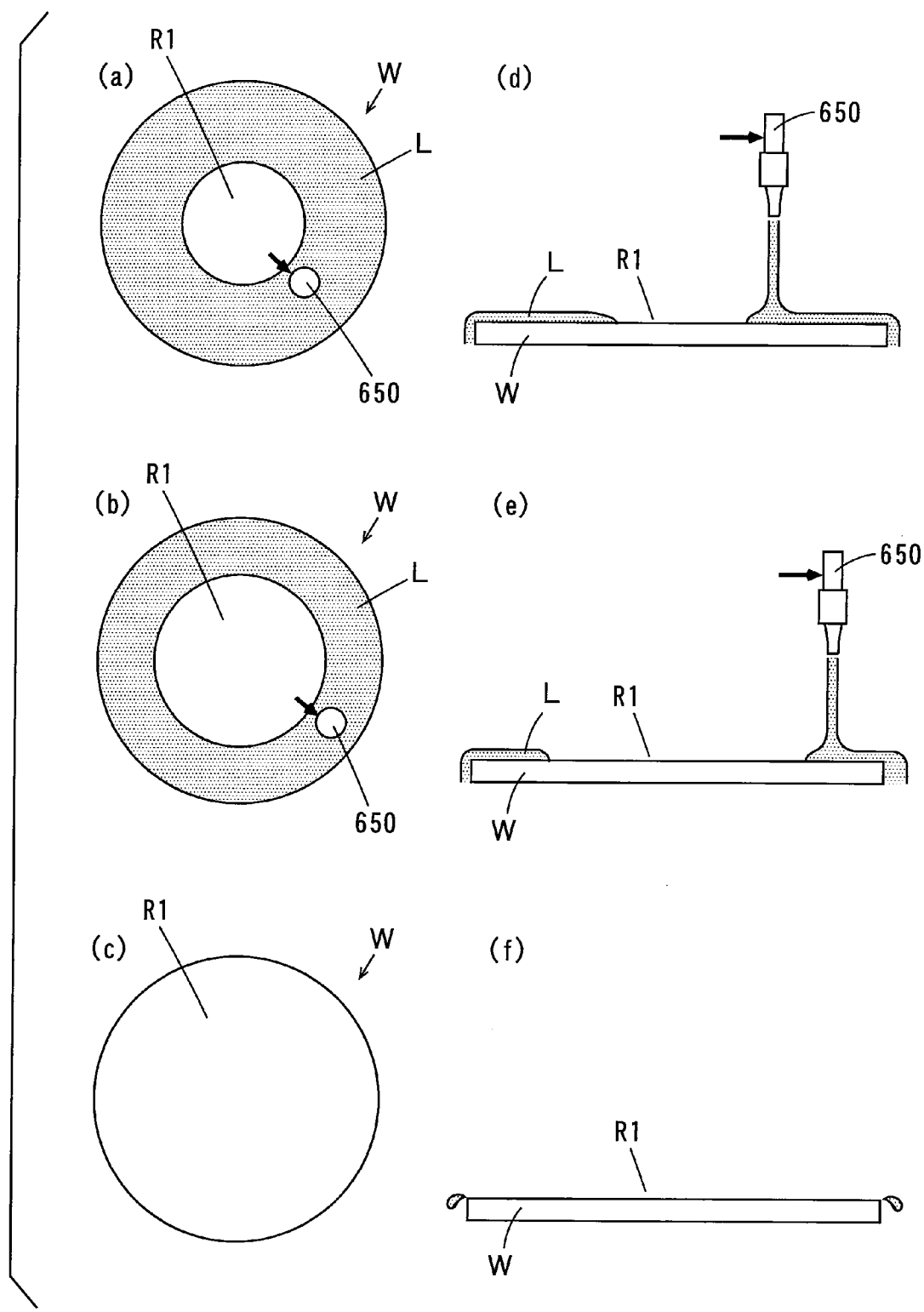
FIG. 8 is a diagram for explaining the details of drying processing for a substrate.

FIGS. 7 and 8 are diagrams for explaining the details of the drying processing for the substrate W. FIGS. 7(a) to 7(c) and FIGS. 8(a) to 8(c) are diagrams of the substrate W as viewed from above, and FIGS. 7(d) to 7(f) and FIGS. 8(d) to 8(f) are diagrams of the substrate W as viewed from the side.

After the substrate W is subjected to the cleaning processing, as described above, the liquid supply nozzle 650 moves to above the center of the substrate W, to discharge the rinse liquid onto the substrate W. This causes the cleaning liquid on the substrate W to be washed away. After an elapse of a predetermined time period, the rotational speed of the substrate W is increased with the discharge of the rinse liquid from the liquid supply nozzle 650 continued. The flow rate of the rinse liquid is 0.2 to 0.8 L/min, for example. In this case, a liquid layer L of the rinse liquid is formed so as to cover one surface of the substrate W, as shown in FIGS. 7(a) and 7(d).

Then, the liquid supply nozzle 650 moves outward from above the center of the substrate W, as shown in FIGS. 7(b) and 7(e). The movement speed is 6 to 10 mm/sec, for example. In this case, the thickness at the center of the liquid layer L is reduced by a centrifugal force caused by the rotation of the substrate W. A region, whose thickness is reduced, of the liquid layer L is hereinafter referred to as a thin layer region.

The liquid supply nozzle 650 is stopped once at the time point where it moves by a predetermined distance from above the center of the substrate W. The horizontal distance between the position where the liquid supply nozzle 650 is stopped and the rotation axis of the substrate W is 15 to 25 mm, for example. A time period during which the liquid supply nozzle 650 is stopped is approximately 10 seconds, for example. In this time period, the liquid layer L is divided within the thin layer region by a centrifugal force, so that a hole (hereinafter referred to as a drying core C) is formed at the center of the liquid layer L, as shown in FIGS. 7(c) and 7(f).

In this case, the liquid supply nozzle 650 is stopped once, so that the expansion of the thin layer region of the liquid layer L is limited. When the thin layer region expands, a plurality of drying cores C may, in some cases, be formed in the thin layer region. In the present embodiment, the plurality of drying cores C are prevented from being formed, and only one drying core C is formed.

The position where and the time when the liquid supply nozzle 650 is stopped once are previously determined by an experiment or the like such that only one drying core C is reliably formed. Furthermore, it is preferable that the timing at which and the position where the liquid supply nozzle 650 is stopped once are set, as needed, depending on various conditions such as the type, the size, the surface condition, and the rotational speed of the substrate W, the discharge flow rate of the rinse liquid from the liquid supply nozzle 650, and the movement speed of the liquid supply nozzle 650.

After the drying core C is formed, the liquid supply nozzle 650 moves outward again, as shown in FIGS. 8(a) and 8(d). Correspondingly, a drying region R1 where no rinse liquid exists expands on the substrate W with the drying core C as a starting point by a centrifugal force.

Then, when the liquid supply nozzle 650 moves to above the peripheral portion of the substrate W, as shown in FIGS. 8(b) and 8(e), the rotational speed of the substrate W is reduced. The movement speed of the liquid supply nozzle 650 is maintained as it is.

Thereafter, the discharge of the rinse liquid is stopped while the liquid supply nozzle 650 moves outward from the substrate W. This causes the drying region R1 to spread over the whole substrate W, causing the substrate W to be dried, as shown in FIGS. 8(c) and 8(f).

In such a way, the liquid supply nozzle 650 moves to above the peripheral portion of the substrate W from above the center of the substrate W while discharging the rinse liquid with the substrate W rotated, so that the drying region R1 is expanding with the liquid layer L of the rinse liquid integrally held on the substrate W. In this case, the surface tension of the liquid layer L can prevent minute droplets from being formed in the drying region R1. This allows the substrate W to be reliably dried.

Furthermore, the liquid supply nozzle 650 is stopped once when it moves by a predetermined distance, which causes the area of the thin layer region of the liquid layer L to be adjusted, causing one drying core C to be reliably formed. When not one drying core C but a plurality of drying cores C are formed, the drying region R1 cannot be stably expanded. A plurality of drying regions R1 respectively expand with the plurality of drying cores C as starting points, which causes the plurality of drying regions R1 to interfere with one another, making it easy to form the minute droplets. By forming only one drying core C, therefore, it is possible for the drying of the substrate W to stably progress while more reliably preventing the minute droplets from remaining on the substrate W.

Description is now made of the change in the rotational speed of the substrate W during the drying processing. FIG. 9 is a diagram showing an example of the change in the rotational speed of the substrate W. In FIG. 9, the horizontal axis indicates the horizontal distance between the rotation axis of the substrate W and the liquid supply nozzle 650, and the vertical axis indicates the rotational speed of the substrate W.

In the example shown in FIG. 9, in a time period during which the horizontal distance between the rotation axis of the substrate W and the liquid supply nozzle 650 is 0 to 60 mm, the rotational speed of the substrate W is set to 1800 to 2100 rpm. When the horizontal distance between the rotation axis of the substrate W and the liquid supply nozzle 650 exceeds 60 mm, the rotational speed of the substrate W is set to 1000 to 1200 rpm. That is, the rotational speed of the substrate W in a time period during which the liquid supply nozzle 650 moves above the peripheral portion of the substrate W is set so as to be lower than the rotational speed of the substrate W in a time period during which the liquid supply nozzle 650 moves above the center of the substrate W.

When the substrate W is rotated, the peripheral speed in the peripheral portion of the substrate W is more than the peripheral speed at the center of the substrate W. Furthermore, the rinse liquid easily becomes turbulent in the peripheral portion of the substrate W. When the rotational speed of the substrate W is constant, therefore, the rinse liquid discharged to the peripheral portion of the substrate W is more easily scattered than the rinse liquid discharged to the center of the substrate W. When the rinse liquid scattered from the peripheral portion of the substrate W adheres to the drying region R1 of the substrate W as minute droplets, the rinse liquid is difficult to remove after that.

By reducing the rotational speed of the substrate W when the liquid supply nozzle 650 moves above the peripheral portion of the substrate W, therefore, the rinse liquid discharged to the peripheral portion of the substrate W can be prevented from being scattered. This more reliably prevents the minute droplets from remaining on the substrate W, causing the substrate W to be more reliably dried.

Although the rotational speed of the substrate W is adjusted in two stages during the drying processing in the present embodiment, the present invention is not limited to the same. For example, the rotational speed of the substrate W may be adjusted in a multiple stage such as three or more stages. Alternatively, the rotational speed of the substrate W may be continuously reduced in a time period during which the liquid supply nozzle 650 moves to above the peripheral portion of the substrate W from above the center of the substrate W.

(4) Effect of Embodiment

In the substrate processing apparatus 500 according to the present embodiment, the substrate W after the exposure processing is subjected to the drying processing in the cleaning/drying processing unit SD2 in the interface block 15 so that the substrate W is reliably dried. This prevents the liquid that has adhered to the substrate W during the exposure processing from dropping in the substrate processing apparatus 500. Therefore, operational troubles such as abnormalities in an electric system of the substrate processing apparatus 500 are prevented.

Furthermore, the particles and the like in the atmosphere are prevented from adhering to the substrate W after the exposure processing, which can prevent the substrate W from being contaminated. Furthermore, the liquid is prevented from remaining on the substrate W, which can prevent the liquid from adversely affecting the resist film and the resist cover film on the substrate W. This can prevent processing defects in the substrate W.

It is possible to prevent the substrate W to which the liquid has adhered from being transported in the substrate processing apparatus 500, and therefore to prevent the liquid that has adhered to the substrate W during the exposure processing from affecting the atmosphere in the substrate processing apparatus 500. This facilitates the adjustment of temperature and humidity in the substrate processing apparatus 500.

Furthermore, the liquid that has adhered to the substrate W during the exposure processing is prevented from adhering to the indexer robot IR and the first to sixth central robots CR1 to CR6, which prevents the liquid from adhering to the substrate W before the exposure processing. This prevents the particles and the like in the atmosphere from adhering to the substrate W before the exposure processing, thereby preventing the substrate W from being contaminated. As a result, it is possible to prevent degradation in resolution performance during the exposure processing while preventing contamination in the exposure device 16.

It is possible to reliably prevent the component of the resist or the resist cover film from being eluted in the cleaning liquid and the rinse liquid remaining on the substrate W while the substrate W is transported from the cleaning/drying processing unit SD2 to the development processing group 70. This can prevent an exposure pattern formed on the resist film from being deformed. As a result, it is possible to reliably prevent line definition during the development processing from being degraded.

In the cleaning/drying processing unit SD2, the substrate W is subjected to the cleaning processing before the drying processing. In this case, even if the particles and the like in the atmosphere adhere to the substrate W to which the liquid has adhered during the exposure processing, the attachment can be removed. This can prevent the substrate W from being contaminated. As a result, it is possible to reliably prevent the processing defects in the substrate.

Before the substrate W is subjected to the exposure processing in the exposure device 16, the substrate W is subjected to the cleaning processing in the cleaning/drying processing unit SD1. During the cleaning processing, a part of the component of the resist cover film on the substrate W is eluted in the cleaning liquid or the rinse liquid and is washed away. Even if the substrate W comes into contact with the liquid in the exposure device 16, therefore, the component of the resist cover film on the substrate W is hardly eluted in the liquid. Furthermore, it is possible to remove the particles and the like that have adhered to the substrate W before the exposure processing. As a result of these, contamination in the exposure device 16 can be reliably prevented.

In the cleaning/drying processing unit SD1, the substrate W is subjected to the drying processing after being subjected to the cleaning processing. This causes the cleaning liquid or the rinse liquid that has adhered to the substrate W during the cleaning processing to be removed, thereby preventing the particles and the like in the atmosphere from adhering to the substrate W after the cleaning processing again. As a result, the contamination in the exposure device 16 can be reliably prevented.

Furthermore, the cleaning liquid or the rinse liquid that has adhered to the substrate W during the cleaning processing is removed, which prevents the cleaning liquid or the rinse liquid from soaking into the resist cover film or the resist film on the substrate W before the exposure processing. This can prevent degradation in resolution performance during the exposure processing.

(5) Another Example of Cleaning/Drying Processing Unit

Figure 10:
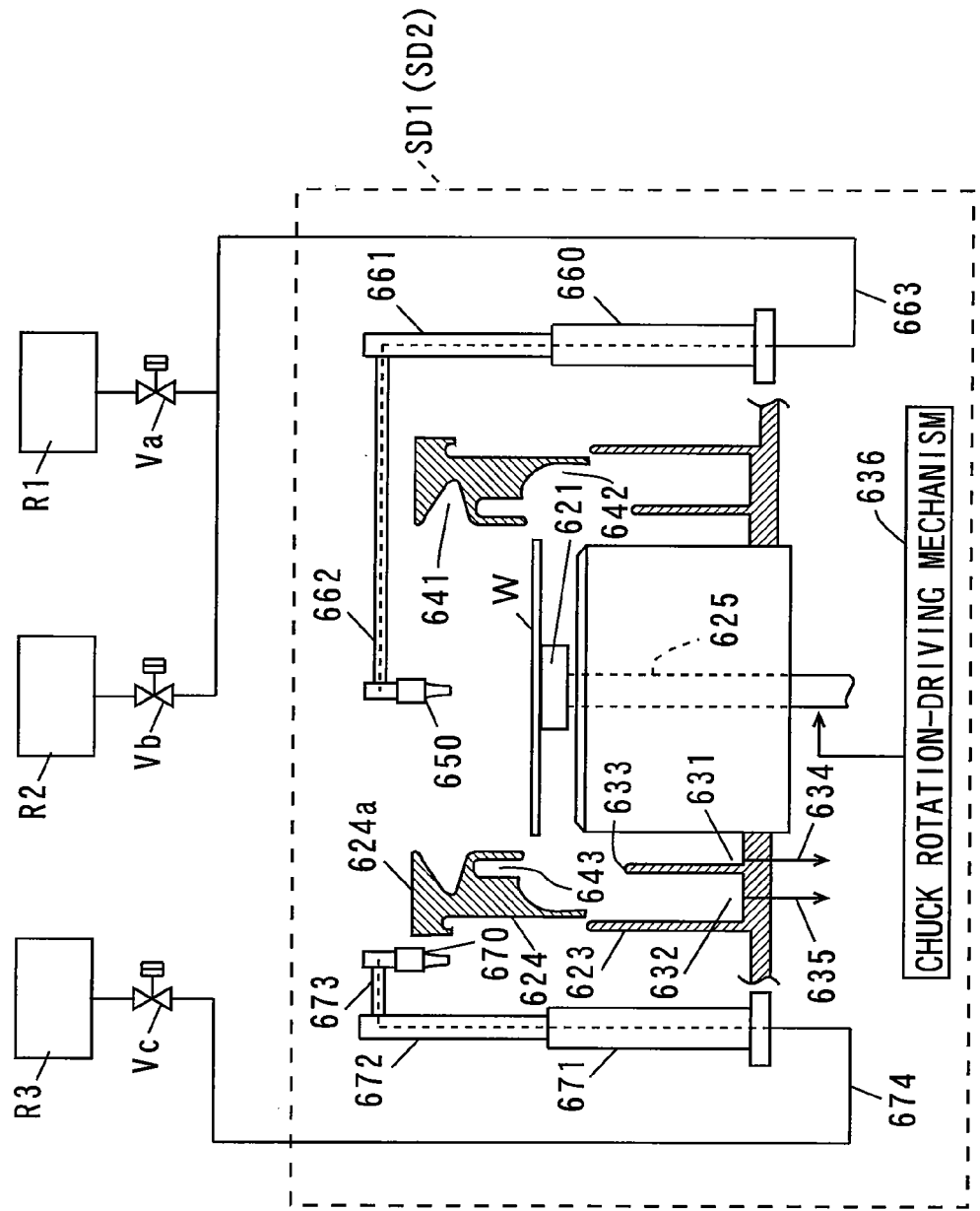
FIG. 10 is a schematic side view showing another configuration of a cleaning/drying processing unit.

FIG. 10 is a schematic side view showing another configuration of the cleaning/drying processing units SD1 and SD2, and FIG. 11 is a schematic plan view of the cleaning/drying processing units SD1 and SD2 shown in FIG. 10. The difference between the cleaning/drying processing units SD1 and SD2 shown in FIGS. 10 and 11 and the cleaning/drying processing units SD1 and SD2 shown in FIGS. 5 and 6 will be described.

In the cleaning/drying processing units SD1 and SD2, a motor 671 is provided at a position opposed to the motor 660 with the spin chuck 621 sandwiched therebetween. A rotating shaft 672 is connected to the motor 671. An arm 673 is connected to the rotating shaft 672 so as to extend in the horizontal direction, and its tip is provided with a gas supply nozzle 670.

The motor 671 causes the rotating shaft 672 to rotate while causing the arm 673 to rotate. This causes the gas supply nozzle 670 to move between a position above the center of a substrate W held by the spin chuck 621 and a position outside the substrate W. In this case, the liquid supply nozzle 650 and the gas supply nozzle 670 respectively move to a position outside the substrate W in opposite directions from above the center of the substrate W.

A supply pipe 674 for drying processing is provided so as to pass through the motor 671, the rotating shaft 672, and the arm 673. The supply pipe 674 is connected to an inert gas supply source R3 through a valve Vc. By controlling the opening and closing of the valve Vc, the supply amount of inert gas to be supplied to the supply pipe 674 can be adjusted.

The inert gas is supplied to the gas supply nozzle 670 through the supply pipe 674 from the inert gas supply source R3. This allows the inert gas to be supplied to a top surface of the substrate W. An example of the inert gas is nitrogen gas. Note that the inert gas may be replaced with another gas such as air.

Figure 12:
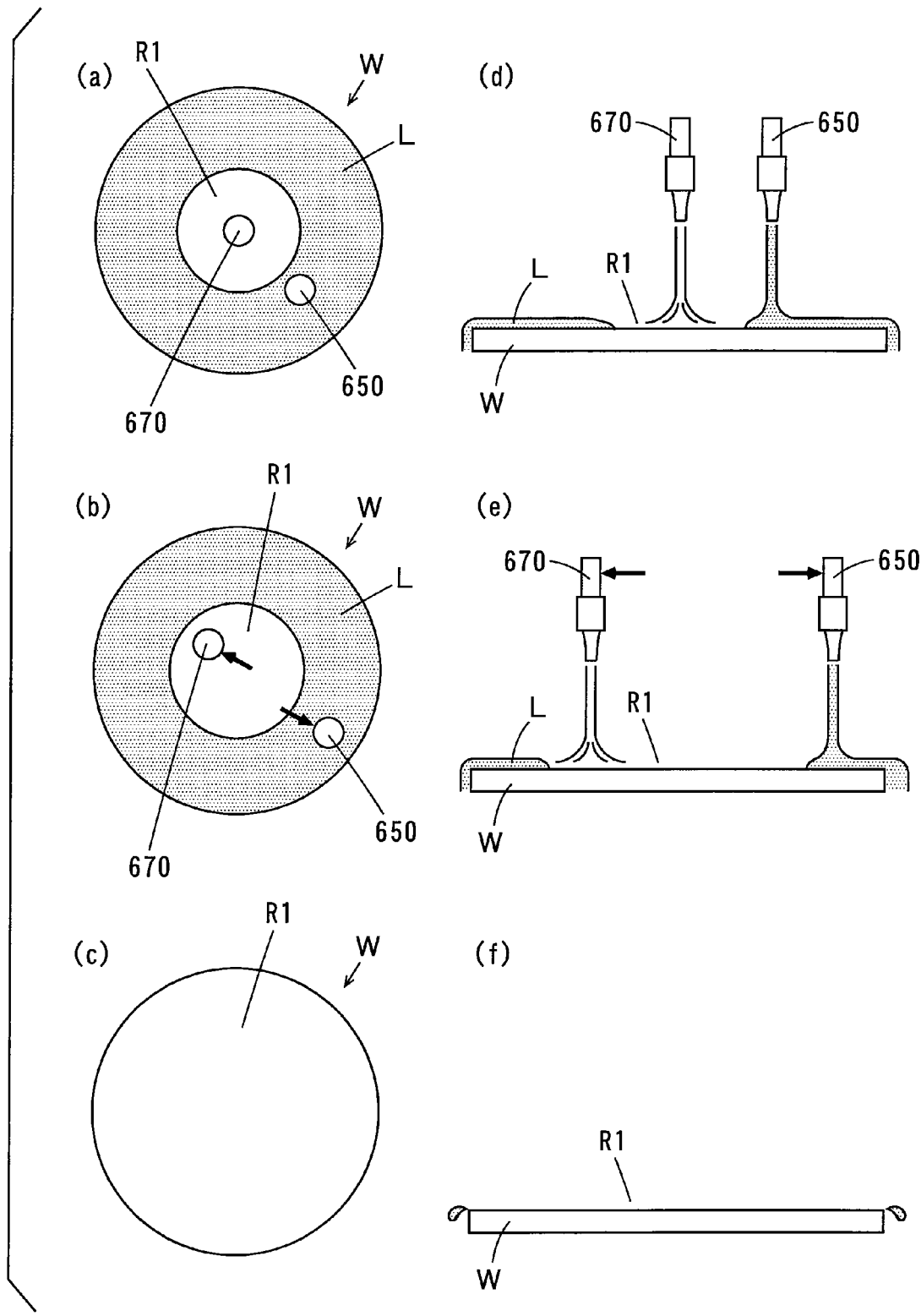
FIG. 12 is a diagram showing a part of drying processing for a substrate in the cleaning/drying processing unit shown in FIGS. 10 and 11.

The drying processing for the substrate W in the cleaning/drying processing units SD1 and SD2 shown in FIGS. 10 and 11 will be then described. FIG. 12 is a diagram showing a part of the drying processing for the substrate W in the cleaning/drying processing units SD1 and SD2 shown in FIGS. 10 and 11.

The operation of the liquid supply nozzle 650 and the change in the rotational speed of the substrate W are the same as those in the cleaning/drying processing units SD1 and SD2 shown in FIGS. 5 and 6. Here, the operation of the gas supply nozzle 670 will be mainly described.

The gas supply nozzle 670 moves to above the center of the substrate W after the liquid supply nozzle 650 starts to move from above the center of the substrate W (see FIGS. 7(*b*) and 7(*e*)). When a drying core C is formed in a liquid layer L (see FIGS. 7(*c*) and 7(*f*)), the gas supply nozzle 670 discharges the inert gas toward the center of the substrate W, as shown in FIGS. 12(*a*) and 12(*d*).

In this case, a drying region R1 is instantaneously expanded with the first drying core C formed in the liquid layer L as a starting point. This prevents the other drying core C from being formed after the first drying core C is formed. When a plurality of drying cores C are formed, as described above, minute droplets are easy to form on the substrate W. Therefore, in this example, the minute droplets can be reliably prevented from being formed.

The timing at which the inert gas is discharged is previously determined by an experiment or the like such that after the first drying core C is formed, the other drying core C is not formed. Furthermore, it is preferable that the timing at which the inert gas is discharged is set, as needed, depending on various conditions such as the type, the size, the surface condition, and the rotational speed of the substrate W, the discharge flow rate of the rinse liquid from the liquid supply nozzle 650, and the movement speed of the liquid supply nozzle 650.

Then, the liquid supply nozzle 650 moves outward while discharging the rinse liquid, and the gas supply nozzle 670 moves in the opposite direction to the liquid supply nozzle 650 while discharging the inert gas, as shown in FIGS. 12(*b*) and 12(*e*). The movement speed of the liquid supply nozzle 650 and the movement speed of the gas supply nozzle 670 are adjusted so as to be approximately equal to each other. Thus, the gas supply nozzle 670 is at a position always closer to the rotation axis of the substrate W than the liquid supply nozzle 650, to discharge the inert gas toward the drying region R1 on the substrate W.

Thereafter, the liquid supply nozzle 650 stops the discharge of the rinse liquid while moving outward from the substrate W, and the gas supply nozzle 670 stops the discharge of the inert gas while moving outward from the substrate W. This causes the drying region R1 to spread over the whole substrate W so that the substrate W is dried, as shown in FIGS. 12(c) and 12(f).

The gas supply nozzle 670 thus moves outward from above the center of the substrate W while discharging the inert gas, which reliably prevents the minute droplets from remaining in the drying region R1 on the substrate W. Furthermore, the drying region R1 can be reliably expanded, which allows the substrate W to be efficiently and reliably dried.

Furthermore, the liquid supply nozzle 650 and the gas supply nozzle 670 move in the opposite directions, so that the rinse liquid discharged from the liquid supply nozzle 650 and the inert gas discharged from the gas supply nozzle 670 do not interfere with each other. This prevents the rinse liquid from being scattered by the interference with the inert gas while preventing the minute droplets of the rinse liquid from adhering to the drying region R1.

Furthermore, the rinse liquid and the inert gas do not interfere with each other, so that the respective degrees of freedom of setting of the flow rate and the discharging angle of the inert gas are increased. This allows the substrate W to be dried more efficiently.

Although in the above-mentioned example, the gas supply nozzle 670 moves to above a peripheral portion of the substrate W from above the center of the substrate W while discharging the inert gas, the gas supply nozzle 670 may discharge the inert gas only for a short time period (e.g., one second) elapsed after the drying core C is formed. That is, the inert gas may be discharged toward the center of the substrate W for approximately one second, for example, as shown in FIGS. 12(a) and 12(d), and the discharge of the inert gas may be then stopped. In this case, the flow rate of the inert gas is adjusted to 10 L/min, for example.

The gas supply nozzle 670 may discharge the inert gas continuously for several seconds toward the center of the substrate W without moving from above the center of the substrate W. In this case, the flow rate of the inert gas is adjusted to 10 L/min, for example.

Although in the above-mentioned example, the liquid supply nozzle 650 and the gas supply nozzle 670 move in the opposite directions from above the center of the substrate W, the liquid supply nozzle 650 and the gas supply nozzle 670 may move in orthogonal directions or in the same direction, for example, provided that the rinse liquid and the inert gas can be inhibited from interfering with each other. When the liquid supply nozzle 650 and the gas supply nozzle 670 move in the same direction, the liquid supply nozzle 650 and the gas supply nozzle 670 may be integrated with each other.

(6) Still Another Example of Cleaning/Drying Processing Unit

Figure 13:
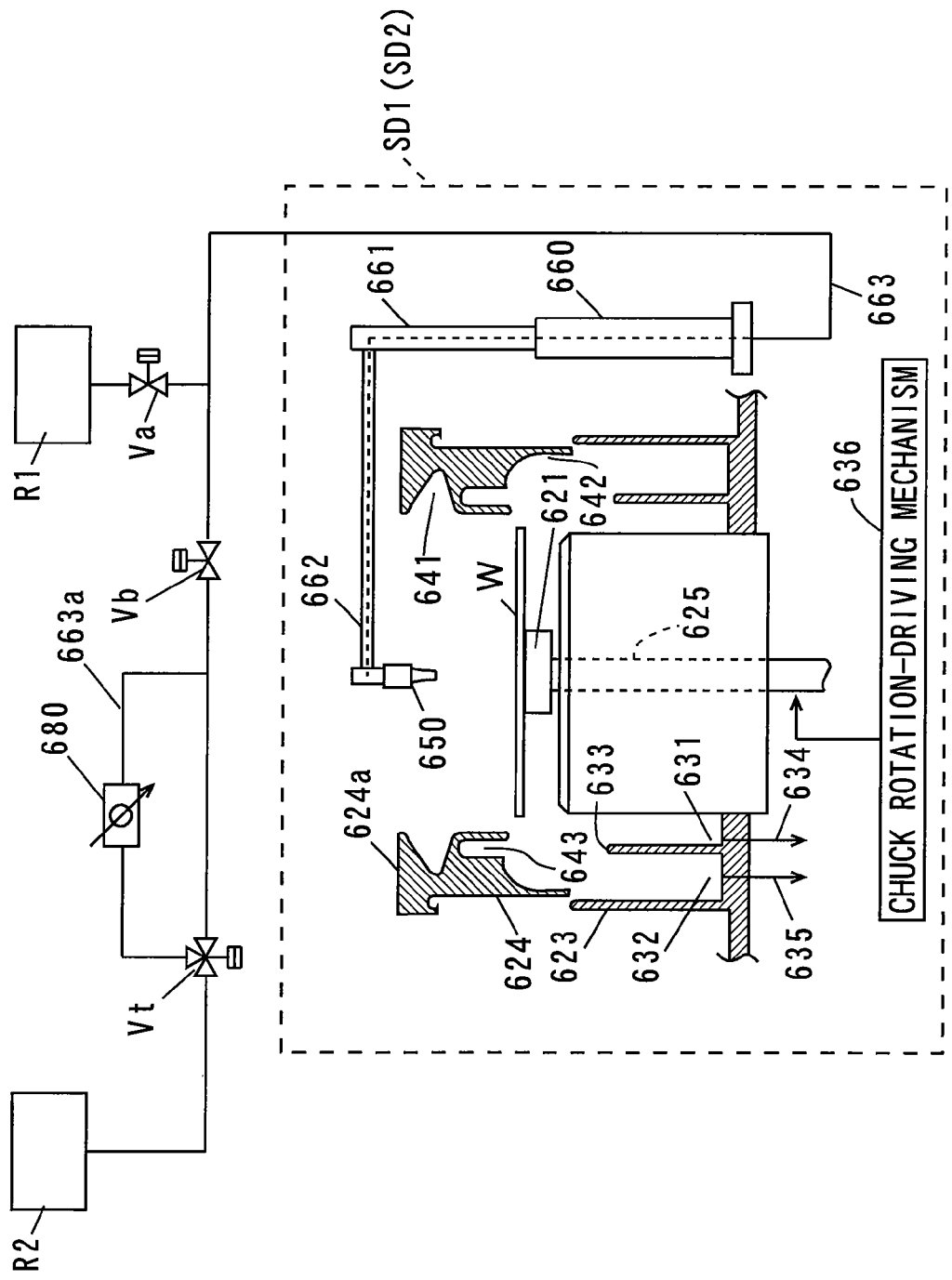
FIG. 13 is a schematic side view showing still another configuration of a cleaning/drying processing unit.

FIG. 13 is a schematic side view showing still another configuration of the cleaning/drying processing unit SD1 and SD2. The difference between the cleaning/drying processing units SD1 and SD2 shown in FIG. 13 and the cleaning/drying processing units SD1 and SD2 shown in FIG. 6 will be described.

Each of the cleaning/drying processing units SD1 and SD2 are provided with a three-way valve Vt, a by-pass pipe 663a, and a flow regulating valve 680. The by-pass pipe 663a has its one end connected to a portion of the supply pipe 663 for cleaning processing on the upstream side of a valve Vb through the three-way valve Vt, the other end thereof being connected to a portion of the supply pipe 663 between the three-way valve Vt and the valve Vb. The flow regulating valve 680 is inserted into the by-pass pipe 663a. The flow regulating valve 680 reduces the flow rate of the rinse liquid supplied to the liquid supply nozzle 650 through the by-pass pipe 663a.

In the cleaning/drying processing units SD1 and SD2 shown in FIGS. 5 and 6, when the liquid supply nozzle 650 moves to above a peripheral portion of the substrate W during drying processing, the rotational speed of the substrate W is reduced. This prevents the rinse liquid discharged to the peripheral portion of the substrate W from being scattered.

On the other hand, in the cleaning/drying processing units SD1 and SD2 shown in FIG. 13, when the liquid supply nozzle 650 moves to above the peripheral portion of the substrate W during the drying processing, the three-way valve Vt is switched such that the rinse liquid is introduced into the by-pass pipe 663a. Note that the rotational speed of the substrate W is kept constant at 1800 to 2100 rpm, for example. In this case, the flow rate of the rinse liquid discharged to the peripheral portion of the substrate W is made lower than the flow rate of the rinse liquid discharged to the vicinity of the center of the substrate W. This prevents the rinse liquid discharged to the peripheral portion of the substrate W from being scattered.

Although the flow rate of the rinse liquid is adjusted in two stages during the drying processing in this example, the present invention is not limited to the same. For example, the flow rate of the rinse liquid may be adjusted in a multiple stage such as three or more stages. Alternatively, the flow rate of the rinse liquid may be continuously reduced in a time period during which the liquid supply nozzle 650 moves outward from the substrate W from above the center of the substrate W.

Furthermore, each of the cleaning/drying processing units SD1 and SD2 shown in FIG. 13 may be provided with the motor 671, the rotating shaft 672, the arm 673, and the gas supply nozzle 670 shown in FIG. 10.

(7) Still Another Example of Cleaning/Drying Processing Unit

Figure 14:
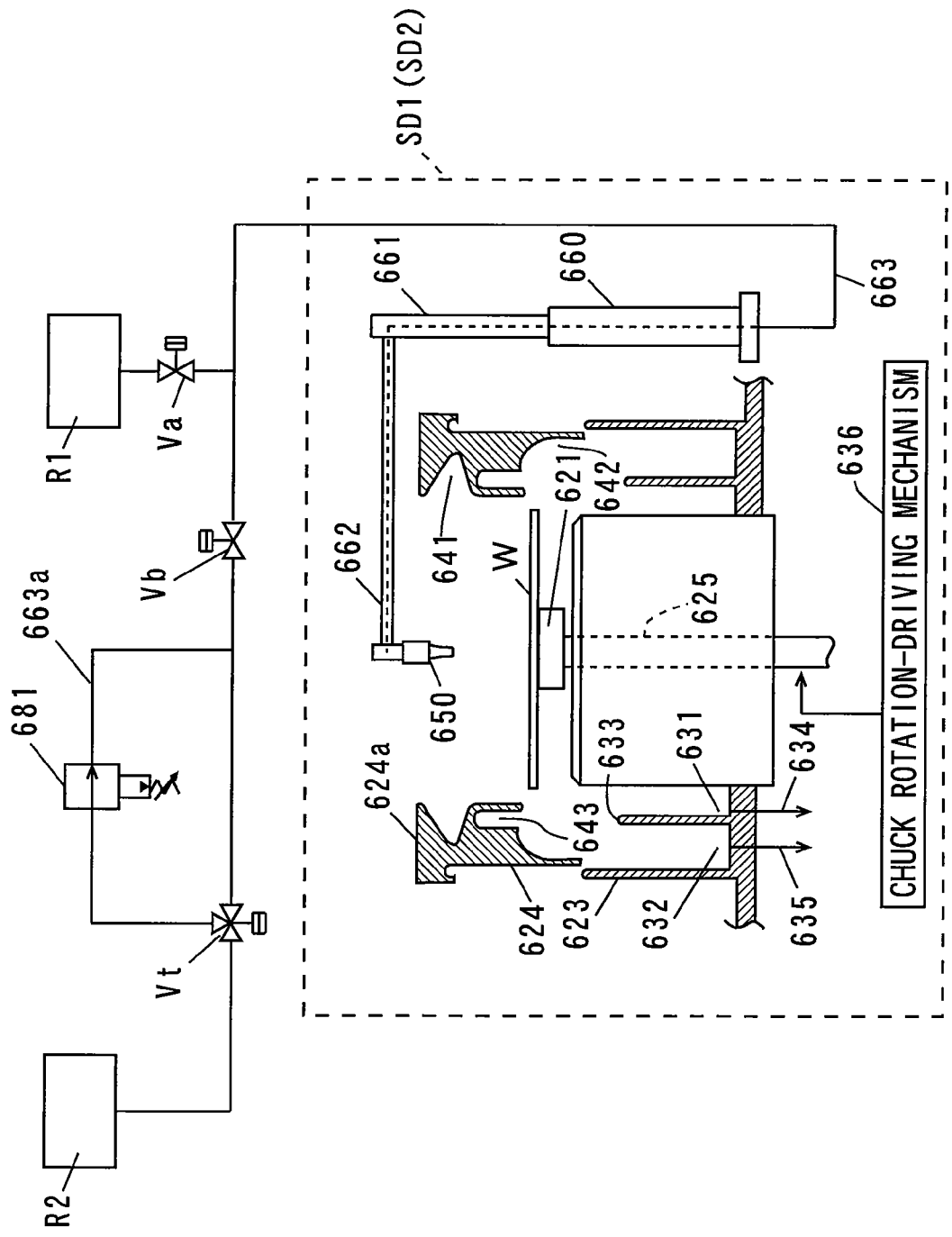
FIG. 14 is a schematic side view showing still another configuration of a cleaning/drying processing unit.

FIG. 14 is a schematic side view showing still another configuration of the cleaning/drying processing unit SD1 and SD2. The difference between the cleaning/drying processing units SD1 and SD2 shown in FIG. 14 and the cleaning/drying processing units SD1 and SD2 shown in FIG. 13 will be described.

In the cleaning/drying processing units SD1 and SD2, the flow regulating valve 680 is replaced with a pressure reducing valve 681. The pressure reducing valve 681 causes the supply pressure of a rinse liquid supplied to a liquid supply nozzle 650 to be reduced through a by-pass pipe 663a.

In the cleaning/drying processing units SD1 and SD2, when the liquid supply nozzle 650 moves to above a peripheral portion of a substrate W during the drying processing, a three-way valve Vt is switched such that the rinse liquid is introduced into the by-pass pipe 663a. In this case, the discharge pressure of the rinse liquid to the peripheral portion of the substrate W is made lower than the discharge pressure of the rinse liquid to the vicinity of the center of the substrate W.

This prevents the rinse liquid discharged to the peripheral portion of the substrate W from being scattered.

Although the discharge pressure of the rinse liquid during drying processing is adjusted in two stages in this example, the present invention is not limited to the same. For example, the discharge pressure of the rinse liquid may be adjusted in a multiple stage such as three or more stages. Alternatively, the discharge pressure of the rinse liquid may be continuously reduced in a time period during which the liquid supply nozzle 650 moves outward from the substrate W from above the center of the substrate W.

Furthermore, each of the cleaning/drying processing units SD1 and SD2 shown in FIG. 14 may be provided with the motor 671, the rotating shaft 672, the arm 673, and the gas supply nozzle 670 shown in FIG. 10.

(8) Another Embodiment

A resist cover film processing block 13 need not be provided. In this case, a part of a component of a resist film is eluted in a cleaning liquid during cleaning processing in a cleaning/drying processing unit SD1. Even if the resist film comes into contact with the liquid in an exposure device 16, the component of the resist film is prevented from being eluted in the liquid. As a result, contamination in the exposure device 16 can be prevented.

When the resist cover film processing block 13 is not provided, a resist cover film removal block 14 need not be provided. This allows the footprint of a substrate processing apparatus 500 to be reduced. When the resist cover film processing block 13 and the resist cover film removal block 14 are not provided, a substrate W is subjected to post-exposure bake in a thermal processing group 121 for development in a development processing block 12.

Although in the above-mentioned embodiment, cleaning/drying processing units SD1 and SD2 are arranged within an interface block 15, at least one of the cleaning/drying processing units SD1 and SD2 may be arranged within the resist cover film removal block 14 shown in FIG. 1. Alternatively, a cleaning/drying processing block including at least one of the cleaning/drying processing units SD1 and SD2 may be provided between the resist cover film removal block 14 and the interface block 15 shown in FIG. 1.

Furthermore, the respective numbers of cleaning/drying processing units SD1, cleaning/drying processing units SD2, coating units BARC, RES, and COV, developing processing units DEV, removal units REM, heating units HP, cooling units CP, and placement/cooling units P-CP may be changed, as needed, depending on the processing speed of each of the processing blocks. When two edge exposure units EEW are provided, for example, the number of cleaning/drying processing units SD2 may be set to two.

(9) Correspondences Between Constituent Elements in Claims and Parts in Embodiments In the following two paragraphs, non-limiting examples of correspondences between various elements recited in the claims below and those described above with respect to various embodiments of the present invention are explained.

In the embodiments described above, the anti-reflection film processing block 10, the resist film processing block 11, the development processing block 12, the resist cover film processing block 13, and the resist cover film removal block 14 are examples of a processing section, the interface block 15 is an example of an interface, and the cleaning/drying processing units SD1 and SD2 are examples of a drying processing unit.

Furthermore, the spin chuck 621 is an example of a substrate holding device, the chuck rotation-driving mechanism 636 is an example of a rotation-driving device, the liquid supply nozzle 650 is an example of a rinse liquid supplier, the motor 660 is an example of a rinse liquid supplier moving mechanism, the gas supply nozzle 670 is an example of a gas supplier, the motor 671 is an example of a gas supplier moving mechanism, and the coating unit RES is an example of a photosensitive film formation unit.

As each of various elements recited in the claims, various other elements having configurations or functions described in the claims can be also used.

While various embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that is arranged adjacent to an exposure device, the substrate processing apparatus comprising:
   a processing section for subjecting a substrate to processing; and
   an interface for transferring and receiving the substrate between the processing section and the exposure device,
   wherein at least one of the processing section and the interface includes a drying processing unit that subjects the substrate to drying processing, the drying processing unit including:
      a substrate holding device that holds the substrate substantially horizontally,
      a rotation-driving device that rotates the substrate held by the substrate holding device around an axis perpendicular to the substrate,
      a rinse liquid supplier that supplies a rinse liquid onto the substrate held by the substrate holding device, to form a liquid layer of the rinse liquid on the substrate, and
      a rinse liquid supplier moving mechanism that moves the rinse liquid supplier such that the rinse liquid is continuously supplied from the center of the rotated substrate to its peripheral portion,
   the rotation-driving device adjusts a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the rinse liquid supplier, and gradually or continuously changes the rotational speed of the substrate such that the substrate is rotated at a first rotational speed with the rinse liquid supplied to the center of the substrate, and rotated at a second rotational speed lower than the first rotational speed with the rinse liquid supplied to the peripheral portion of the substrate, and
   the rinse liquid supplier moving mechanism stops the movement of the rinse liquid supplier for a predetermined time period such that the expansion of the thin layer region is stopped, and only one drying core is formed at the center of the substrate by the centrifugal force caused by the rotation of the substrate with the rinse liquid supplied to a position spaced apart from the center of the substrate by a predetermined distance.

2. The substrate processing apparatus according to claim 1 wherein the drying processing unit further includes a gas supplier that discharges gas to the center of the substrate with the rinse liquid supplied to a position spaced apart from the center of the substrate by the rinse liquid supplier.

3. The substrate processing apparatus according to claim 2 wherein the drying processing unit further includes a gas supplier moving mechanism that moves the gas supplier such that the position where the gas is supplied on the substrate moves from the center of the substrate to the peripheral portion of the substrate at a position closer to the center of the substrate than the position where the rinse liquid is supplied by the rinse liquid supplier.

4. The substrate processing apparatus according claim 1 wherein the processing section further includes:
a photosensitive film formation unit that forms a photosensitive film composed of a photosensitive material on the substrate before the exposure processing, and
a development processing unit that subjects the substrate after the exposure processing to development processing, and
the drying processing unit subjects the substrate to the drying processing after the exposure processing by the exposure device and before the development processing by the development processing unit.

5. A substrate processing apparatus that is arranged adjacent to an exposure device, the substrate processing apparatus comprising:
a processing section for subjecting a substrate to processing; and
an interface for transferring and receiving the substrate between the processing section and the exposure device,
wherein at least one of the processing section and the interface includes a drying processing unit that subjects the substrate to drying processing, the drying processing unit including:
a substrate holding device that holds the substrate substantially horizontally,
a rotation-driving device that rotates the substrate held by the substrate holding device around an axis perpendicular to the substrate,
a rinse liquid supplier that supplies a rinse liquid onto the substrate held by the substrate holding device, to form a liquid layer of the rinse liquid on the substrate,
the rinse liquid supplier moving mechanism that moves the rinse liquid supplier such that the rinse liquid is continuously supplied from the center of the rotated substrate to its peripheral portion,
the rotation-driving device adjusts a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the rinse liquid supplier,
the rinse liquid supplier gradually or continuously changes the flow rate of the rinse liquid such that the rinse liquid is supplied to the center of the substrate at a first flow rate, and supplied to the peripheral portion of the substrate at a second flow rate lower than the first flow rate, and
the rinse liquid supplier moving mechanism stops the movement of the rinse liquid supplier for a predetermined time period such that the expansion of the thin layer region is stopped, and only one drying core is formed at the center of the substrate by the centrifugal force caused by the rotation of the substrate with the rinse liquid supplied to a position spaced apart from the center of the substrate by a predetermined distance.

6. The substrate processing apparatus according to claim 5 wherein the drying processing unit further includes a gas supplier that discharges gas to the center of the substrate with the rinse liquid supplied to a position spaced apart from the center of the substrate by the rinse liquid supplier.

7. The substrate processing apparatus according to claim 6 wherein the drying processing unit further includes a gas supplier moving mechanism that moves the gas supplier such that the position where the gas is supplied on the substrate moves from the center of the substrate to the peripheral portion of the substrate at a position closer to the center of the substrate than the position where the rinse liquid is supplied by the rinse liquid supplier.

8. The substrate processing apparatus according claim 5 wherein the processing section further includes:
a photosensitive film formation unit that forms a photosensitive film composed of a photosensitive material on the substrate before the exposure processing,
a development processing unit that subjects the substrate after the exposure processing to development processing, and
the drying processing unit subjects the substrate to the drying processing after the exposure processing by the exposure device and before the development processing by the development processing unit.

9. A substrate processing apparatus that is arranged adjacent to an exposure device, the substrate processing apparatus comprising:
a processing section for subjecting a substrate to processing; and
an interface for transferring and receiving the substrate between the processing section and the exposure device,
wherein at least one of the processing section and the interface includes a drying processing unit that subjects the substrate to drying processing, the drying processing unit including:
a substrate holding device that holds the substrate substantially horizontally,
a rotation-driving device that rotates the substrate held by the substrate holding device around an axis perpendicular to the substrate,
a rinse liquid supplier that supplies a rinse liquid onto the substrate held by the substrate holding device, to form a liquid layer of the rinse liquid on the substrate,
a rinse liquid supplier moving mechanism that moves the rinse liquid supplier such that the rinse liquid is continuously supplied from the center of the rotated substrate to its peripheral portion,
the rotation-driving device adjusts a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the rinse liquid supplier,
the rinse liquid supplier gradually or continuously changes the supply pressure of the rinse liquid such that the rinse liquid is supplied to the center of the substrate at a first supply pressure, and supplied to the peripheral portion of the substrate at a second supply pressure lower than the first supply pressure, and the rinse liquid supplier moving mechanism stops the movement of the rinse liquid supplier for a predetermined time period such that the expansion of the thin layer region is stopped, and only one drying core is formed at the center of the substrate by the centrifugal force caused by the rotation of the substrate with the rinse liquid supplied to a position spaced apart from the center of the substrate by a predetermined distance.

10. The substrate processing apparatus according to claim 9 wherein the drying processing unit further includes a gas supplier that discharges gas to the center of the substrate with the rinse liquid supplied to a position spaced apart from the center of the substrate by the rinse liquid supplier.

11. The substrate processing apparatus according to claim 10 wherein the drying processing unit further includes a gas supplier moving mechanism that moves the gas supplier such that the position where the gas is supplied on the substrate moves from the center of the substrate to the peripheral portion of the substrate at a position closer to the center of the substrate than the position where the rinse liquid is supplied by the rinse liquid supplier.

12. The substrate processing apparatus according claim 9 wherein the processing section further includes:
a photosensitive film formation unit that forms a photosensitive film composed of a photosensitive material on the substrate before the exposure processing, and
a development processing unit that subjects the substrate after the exposure processing to development processing, and
the drying processing unit subjects the substrate to the drying processing after the exposure processing by the exposure device and before the development processing by the development processing unit.

13. A substrate processing method for processing a substrate in a substrate processing apparatus that is arranged adjacent to an exposure device and includes a processing section and an interface, the substrate processing method comprising the steps of:
subjecting the substrate to processing before exposure processing by the processing section;
transferring and receiving the substrate processed by the processing section from the processing section to the exposure device by the interface;
transferring and receiving the substrate after the exposure processing by the exposure device from the exposure device to the processing section by the interface;
subjecting the substrate to processing after the exposure processing by the processing section; and
subjecting the substrate to drying processing in at least one of the processing section and the interface,
wherein the step of subjecting the substrate to the drying processing includes the steps of:
rotating the substrate around an axis perpendicular to the substrate while holding the substrate substantially horizontally,
supplying a rinse liquid to a center of the rotated substrate to form a liquid layer of the rinse liquid on the substrate, and
moving a supply position of the rinse liquid such that the rinse liquid is continuously supplied from the center of the rotated substrate to its peripheral portion,
the step of rotating the substrate includes the step of adjusting a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the supply position of the rinse liquid, and gradually or continuously changing the rotational speed of the substrate such that the substrate is rotated at a first rotational speed in a time period during which the rinse liquid is supplied to the center of the substrate, and rotated at a second rotational speed lower than the first rotational speed in a time period during which the rinse liquid is supplied to the peripheral portion of the substrate, and
the step of moving the supply position of the rinse liquid includes the step of maintaining for a predetermined time period the state where the rinse liquid is supplied to a position spaced apart from the center of the substrate by a predetermined distance such that the expansion of the thin layer region is stopped, and only one drying core is formed at the center of the substrate by the centrifugal force caused by the rotation of the substrate.

14. A substrate processing method for processing a substrate in a substrate processing apparatus that is arranged adjacent to an exposure device and includes a processing section and an interface, the substrate processing method comprising the steps of:
subjecting the substrate to processing before exposure processing by the processing section;
transferring and receiving the substrate processed by the processing section from the processing section to the exposure device by the interface;
transferring and receiving the substrate after the exposure processing by the exposure device from the exposure device to the processing section by the interface;
subjecting the substrate to processing after the exposure processing by the processing section; and
subjecting the substrate to drying processing in at least one of the processing section and the interface, wherein the step of subjecting the substrate to the drying processing includes the steps of:
rotating the substrate around an axis perpendicular to the substrate while holding the substrate substantially horizontally,
supplying a rinse liquid to a center of the rotated substrate to form a liquid layer of the rinse liquid on the substrate, and
moving a supply position of the rinse liquid such that the rinse liquid is continuously supplied from the center of the rotated substrate to its peripheral portion, and
the step of rotating the substrate includes the step of adjusting a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the supply position of the rinse liquid,
the step of moving the supply position of the rinse liquid includes the step of gradually or continuously changing the flow rate of the rinse liquid such that the rinse liquid is supplied to the center of the substrate at a first flow rate, and supplied to the peripheral portion of the substrate at a second flow rate lower than the first flow rate, and
the step of moving the supply position of the rinse liquid includes the step of maintaining for a predetermined time period the state where the rinse liquid is supplied to a position spaced apart from the center of the substrate by a predetermined distance such that the expansion of the thin layer region is stopped, and only one drying core is formed at the center of the substrate by the centrifugal force caused by the rotation of the substrate.

15. A substrate processing method for processing a substrate in a substrate processing apparatus that is arranged adjacent to an exposure device and includes a processing section and an interface, the substrate processing method comprising the steps of:

subjecting the substrate to processing before exposure processing by the processing section;

transferring and receiving the substrate processed by the processing section from the processing section to the exposure device by the interface;

transferring and receiving the substrate after the exposure processing by the exposure device from the exposure device to the processing section by the interface;

subjecting the substrate to processing after the exposure processing by the processing section; and subjecting the substrate to drying processing in at least one of the processing section and the interface, wherein the step of subjecting the substrate to the drying processing includes the steps of:

rotating the substrate around an axis perpendicular to the substrate while holding the substrate substantially horizontally, supplying a rinse liquid to a center of the rotated substrate to form a liquid layer of the rinse liquid on the substrate, and moving a supply position of the rinse liquid such that the rinse liquid is continuously supplied from the center of the rotated substrate to its peripheral portion, and the step of rotating the substrate includes the step of adjusting a rotational speed of the substrate such that a thin layer region of the liquid layer of the rinse liquid whose thickness is smaller than a thickness of a remaining region of the liquid layer is formed at the center of the substrate, and the thin layer region gradually expands by a centrifugal force by the movement of the supply position of the rinse liquid, the step of moving the supply position of the rinse liquid includes the step of gradually or continuously changing the supply pressure of the rinse liquid such that the rinse liquid is supplied to the center of the substrate at a first supply pressure, and supplied to the peripheral portion of the substrate at a second supply pressure lower than the first supply pressure, and the step of moving the supply position of the rinse liquid includes the step of maintaining for a predetermined time period the state where the rinse liquid is supplied to a position spaced apart from the center of the substrate by a predetermined distance such that the expansion of the thin layer region is stopped, and only one drying core is formed at the center of the substrate by the centrifugal force caused by the rotation of the substrate.

* * * * *